(12) United States Patent
Kim et al.

(10) Patent No.: US 8,026,589 B1
(45) Date of Patent: Sep. 27, 2011

(54) REDUCED PROFILE STACKABLE SEMICONDUCTOR PACKAGE

(75) Inventors: Bong Chan Kim, Seongnam-si (KR);
Do Hyung Kim, Sunpo-si (KR); Chan Ha Hwang, Anyang-si (KR); Min Woo Lee, Mapo-gu (KR); Eun Sook Sohn, Sungdong-gu (KR); Won Joon Kang, Seodaemun-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 304 days.

(21) Appl. No.: 12/390,999

(22) Filed: Feb. 23, 2009

(51) Int. Cl.
*H01L 23/48* (2006.01)

(52) U.S. Cl. ........ 257/690; 257/686; 257/693; 438/126; 438/617

(58) Field of Classification Search .................. 257/686, 257/690, 693; 438/126, 617
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Phuc Dang
(74) *Attorney, Agent, or Firm* — Stetina Brunda Garred & Brucker

(57) ABSTRACT

In accordance with the present invention, there is provided multiple embodiments of a reduced profile stackable semiconductor package. The semiconductor package comprises a substrate having at least one semiconductor die attached thereto. The semiconductor die is also electrically connected to the substrate by a plurality of conductive wires. A package body defining opposed top and bottom surfaces and a side surface at least partially encapsulates the substrate, the conductive wires and the semiconductor die. The package body is formed such that at least portions of the conductive wires are exposed in the top surface thereof. The package body may include a groove formed in the top surface thereof, with at least portions of the conductive wires being exposed in the groove. In this instance, conductive material layers may be disposed within the groove and electrically connected to the exposed portions of respective ones of the conductive wires, with solder pads further bring electrically connected to respective ones of the conductive material layers and at least partially residing within the groove.

25 Claims, 25 Drawing Sheets

U.S. PATENT DOCUMENTS

| | | | |
|---|---|---|---|
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kikuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,767,566 A | 6/1998 | Suda | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,511 A | 12/1998 | Shin et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,973,935 A | 10/1999 | Schoenfeld et al. | |
| 5,977,630 A | 11/1999 | Woodworth et al. | |
| RE36,773 E | 7/2000 | Nomi et al. | |
| 6,107,679 A | 8/2000 | Noguchi | |
| 6,143,981 A | 11/2000 | Glenn | |
| 6,150,709 A | 11/2000 | Shin et al. | |
| 6,166,430 A | 12/2000 | Yamaguchi | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,777 B1 | 2/2001 | Abbott et al. | |

| | | | | | | |
|---|---|---|---|---|---|---|
| 6,197,615 | B1 | 3/2001 | Song et al. | 6,476,474 | B1 | 11/2002 | Hung |
| 6,198,171 | B1 | 3/2001 | Huang et al. | 6,482,680 | B1 | 11/2002 | Khor et al. |
| 6,201,186 | B1 | 3/2001 | Daniels et al. | 6,483,178 | B1 | 11/2002 | Chuang |
| 6,201,292 | B1 | 3/2001 | Yagi et al. | 6,492,718 | B2 | 12/2002 | Ohmori |
| 6,204,554 | B1 | 3/2001 | Ewer et al. | 6,495,909 | B2 | 12/2002 | Jung et al. |
| 6,208,020 | B1 | 3/2001 | Minamio et al. | 6,498,099 | B1 | 12/2002 | McClellan et al. |
| 6,208,021 | B1 | 3/2001 | Ohuchi et al. | 6,498,392 | B2 | 12/2002 | Azuma |
| 6,208,023 | B1 | 3/2001 | Nakayama et al. | 6,507,096 | B2 | 1/2003 | Gang |
| 6,211,462 | B1 | 4/2001 | Carter, Jr. et al. | 6,507,120 | B2 | 1/2003 | Lo et al. |
| 6,218,731 | B1 | 4/2001 | Huang et al. | 6,518,089 | B2 | 2/2003 | Coyle |
| 6,222,258 | B1 | 4/2001 | Asano et al. | 6,525,942 | B2 | 2/2003 | Huang et al. |
| 6,222,259 | B1 | 4/2001 | Park et al. | 6,528,893 | B2 | 3/2003 | Jung et al. |
| 6,225,146 | B1 | 5/2001 | Yamaguchi et al. | 6,534,849 | B1 | 3/2003 | Gang |
| 6,229,200 | B1 | 5/2001 | McClellan et al. | 6,545,332 | B2 | 4/2003 | Huang |
| 6,229,205 | B1 | 5/2001 | Jeong et al. | 6,545,345 | B1 | 4/2003 | Glenn et al. |
| 6,238,952 | B1 | 5/2001 | Lin et al. | 6,552,421 | B2 | 4/2003 | Kishimoto et al. |
| 6,239,367 | B1 | 5/2001 | Hsuan et al. | 6,559,525 | B2 | 5/2003 | Huang |
| 6,239,384 | B1 | 5/2001 | Smith et al. | 6,566,168 | B2 | 5/2003 | Gang |
| 6,242,281 | B1 | 6/2001 | McClellan et al. | 6,580,161 | B2 | 6/2003 | Kobayakawa |
| 6,256,200 | B1 | 7/2001 | Lam et al. | 6,583,503 | B2 | 6/2003 | Akram et al. |
| 6,258,629 | B1 | 7/2001 | Niones et al. | 6,585,905 | B1 | 7/2003 | Fan et al. |
| 6,261,864 | B1 | 7/2001 | Jung et al. | 6,603,196 | B2 | 8/2003 | Lee et al. |
| 6,281,566 | B1 | 8/2001 | Magni | 6,624,005 | B1 | 9/2003 | DiCaprio et al. |
| 6,281,568 | B1 | 8/2001 | Glenn et al. | 6,627,977 | B1 | 9/2003 | Foster |
| 6,282,094 | B1 | 8/2001 | Lo et al. | 6,646,339 | B1 | 11/2003 | Ku |
| 6,282,095 | B1 | 8/2001 | Houghton et al. | 6,667,546 | B2 | 12/2003 | Huang et al. |
| 6,285,075 | B1 | 9/2001 | Combs et al. | 6,677,663 | B1 | 1/2004 | Ku et al. |
| 6,291,271 | B1 | 9/2001 | Lee et al. | 6,686,649 | B1 | 2/2004 | Matthews et al. |
| 6,291,273 | B1 | 9/2001 | Miyaki et al. | 6,696,752 | B2 | 2/2004 | Su et al. |
| 6,294,100 | B1 | 9/2001 | Fan et al. | 6,700,189 | B2 | 3/2004 | Shibata |
| 6,294,830 | B1 | 9/2001 | Fjelstad | 6,713,375 | B2 | 3/2004 | Shenoy |
| 6,295,977 | B1 | 10/2001 | Ripper et al. | 6,757,178 | B2 | 6/2004 | Okabe et al. |
| 6,297,548 | B1 | 10/2001 | Moden et al. | 6,800,936 | B2 | 10/2004 | Kosemura et al. |
| 6,303,984 | B1 | 10/2001 | Corisis | 6,812,552 | B2 | 11/2004 | Islam et al. |
| 6,303,997 | B1 | 10/2001 | Lee | 6,818,973 | B1 | 11/2004 | Foster |
| 6,306,685 | B1 | 10/2001 | Liu et al. | 6,858,919 | B2 | 2/2005 | Seo et al. |
| 6,307,272 | B1 | 10/2001 | Takahashi et al. | 6,867,492 | B2 | 3/2005 | Auburger et al. |
| 6,309,909 | B1 | 10/2001 | Ohgiyama | 6,876,068 | B1 | 4/2005 | Lee et al. |
| 6,316,822 | B1 | 11/2001 | Venkateshwaran et al. | 6,878,571 | B2 | 4/2005 | Isaak et al. |
| 6,316,838 | B1 | 11/2001 | Ozawa et al. | 6,897,552 | B2 | 5/2005 | Nakao |
| 6,323,550 | B1 | 11/2001 | Martin et al. | 6,927,478 | B2 | 8/2005 | Paek |
| 6,326,243 | B1 | 12/2001 | Suzuya et al. | 6,967,125 | B2 | 11/2005 | Fee et al. |
| 6,326,244 | B1 | 12/2001 | Brooks et al. | 6,995,459 | B2 | 2/2006 | Lee et al. |
| 6,326,678 | B1 | 12/2001 | Karnezos et al. | 7,002,805 | B2 | 2/2006 | Lee et al. |
| 6,335,564 | B1 | 1/2002 | Pour | 7,005,327 | B2 | 2/2006 | Kung et al. |
| 6,337,510 | B1 | 1/2002 | Chun-Jen et al. | 7,015,571 | B2 | 3/2006 | Chang et al. |
| 6,339,252 | B1 | 1/2002 | Niones et al. | 7,045,396 | B2 | 5/2006 | Crowley et al. |
| 6,339,255 | B1 | 1/2002 | Shin | 7,053,469 | B2 | 5/2006 | Koh et al. |
| 6,342,730 | B1 | 1/2002 | Jung et al. | 7,075,816 | B2 | 7/2006 | Fee et al. |
| 6,348,726 | B1 | 2/2002 | Bayan et al. | 7,102,209 | B1 | 9/2006 | Bayan et al. |
| 6,355,502 | B1 | 3/2002 | Kang et al. | 7,109,572 | B2 | 9/2006 | Fee et al. |
| 6,359,221 | B1 | 3/2002 | Yamada et al. | 7,185,426 | B1 | 3/2007 | Hiner |
| 6,362,525 | B1 | 3/2002 | Rahim | 7,193,298 | B2 | 3/2007 | Hong et al. |
| 6,369,447 | B2 | 4/2002 | Mori | 7,211,471 | B1 | 5/2007 | Foster |
| 6,369,454 | B1 | 4/2002 | Chung | 7,242,081 | B1 | 7/2007 | Lee |
| 6,373,127 | B1 | 4/2002 | Baudouin et al. | 7,245,007 | B1 | 7/2007 | Foster |
| 6,377,464 | B1 | 4/2002 | Hashemi et al. | 7,253,503 | B1 | 8/2007 | Fusaro et al. |
| 6,380,048 | B1 | 4/2002 | Boon et al. | 7,750,465 | B2 * | 7/2010 | Hess et al. ............... 257/724 |
| 6,384,472 | B1 | 5/2002 | Huang | 2001/0008305 | A1 | 7/2001 | McClellan et al. |
| 6,388,336 | B1 | 5/2002 | Venkateshwaran et al. | 2001/0014538 | A1 | 8/2001 | Kwan et al. |
| 6,395,578 | B1 | 5/2002 | Shin et al. | 2002/0011654 | A1 | 1/2002 | Kimura |
| 6,399,415 | B1 | 6/2002 | Bayan et al. | 2002/0024122 | A1 | 2/2002 | Jung et al. |
| 6,400,004 | B1 | 6/2002 | Fan et al. | 2002/0027297 | A1 | 3/2002 | Ikenaga et al. |
| 6,410,979 | B2 | 6/2002 | Abe | 2002/0038873 | A1 | 4/2002 | Hiyoshi |
| 6,414,385 | B1 | 7/2002 | Huang et al. | 2002/0072147 | A1 | 6/2002 | Sayanagi et al. |
| 6,420,779 | B1 | 7/2002 | Sharma et al. | 2002/0111009 | A1 | 8/2002 | Huang et al. |
| 6,421,013 | B1 | 7/2002 | Chung | 2002/0140061 | A1 | 10/2002 | Lee |
| 6,423,643 | B1 | 7/2002 | Furuhata et al. | 2002/0140068 | A1 | 10/2002 | Lee et al. |
| 6,429,508 | B1 | 8/2002 | Gang | 2002/0140081 | A1 | 10/2002 | Chou et al. |
| 6,437,429 | B1 | 8/2002 | Su et al. | 2002/0158318 | A1 | 10/2002 | Chen |
| 6,444,499 | B1 | 9/2002 | Swiss et al. | 2002/0163015 | A1 | 11/2002 | Lee et al. |
| 6,448,633 | B1 | 9/2002 | Yee et al. | 2002/0167060 | A1 | 11/2002 | Buijsman et al. |
| 6,452,279 | B2 | 9/2002 | Shimoda | 2003/0006055 | A1 | 1/2003 | Chien-Hung et al. |
| 6,459,148 | B1 | 10/2002 | Chun-Jen et al. | 2003/0030131 | A1 | 2/2003 | Lee et al. |
| 6,464,121 | B2 | 10/2002 | Reijinders | 2003/0059644 | A1 | 3/2003 | Datta et al. |
| 6,465,883 | B2 | 10/2002 | Olofsson | 2003/0064548 | A1 | 4/2003 | Isaak |
| 6,472,735 | B2 | 10/2002 | Isaak | 2003/0073265 | A1 | 4/2003 | Hu et al. |
| 6,475,646 | B2 | 11/2002 | Park et al. | 2003/0102537 | A1 | 6/2003 | McLellan et al. |
| 6,476,469 | B2 | 11/2002 | Hung et al. | 2003/0164554 | A1 | 9/2003 | Fee et al. |

| | | | | | | |
|---|---|---|---|---|---|---|
| 2003/0168719 | A1 | 9/2003 | Cheng et al. | JP | 5129473 | 5/1993 |
| 2003/0198032 | A1 | 10/2003 | Collander et al. | JP | 5166992 | 7/1993 |
| 2004/0027788 | A1 | 2/2004 | Chiu et al. | JP | 5283460 | 10/1993 |
| 2004/0056277 | A1 | 3/2004 | Karnezos | JP | 6061401 | 3/1994 |
| 2004/0061212 | A1 | 4/2004 | Karnezos | JP | 692076 | 4/1994 |
| 2004/0061213 | A1 | 4/2004 | Karnezos | JP | 6140563 | 5/1994 |
| 2004/0063242 | A1 | 4/2004 | Karnezos | JP | 652333 | 9/1994 |
| 2004/0063246 | A1 | 4/2004 | Karnezos | JP | 6252333 | 9/1994 |
| 2004/0065963 | A1 | 4/2004 | Karnezos | JP | 6260532 | 9/1994 |
| 2004/0080025 | A1 | 4/2004 | Kasahara et al. | JP | 7297344 | 11/1995 |
| 2004/0089926 | A1 | 5/2004 | Hsu et al. | JP | 7312405 | 11/1995 |
| 2004/0164387 | A1 | 8/2004 | Ikenaga et al. | JP | 8064364 | 3/1996 |
| 2004/0253803 | A1 | 12/2004 | Tomono et al. | JP | 8083877 | 3/1996 |
| 2006/0087020 | A1 | 4/2006 | Hirano et al. | JP | 8125066 | 5/1996 |
| 2006/0108676 | A1* | 5/2006 | Punzalan et al. .............. 257/686 | JP | 964284 | 6/1996 |
| 2006/0157843 | A1 | 7/2006 | Hwang | JP | 8222682 | 8/1996 |
| 2006/0216868 | A1 | 9/2006 | Yang et al. | JP | 8306853 | 11/1996 |
| 2006/0231939 | A1 | 10/2006 | Kawabata et al. | JP | 98205 | 1/1997 |
| 2007/0023202 | A1 | 2/2007 | Shibata | JP | 98206 | 1/1997 |
| 2008/0230887 | A1 | 9/2008 | Sun et al. | JP | 98207 | 1/1997 |

FOREIGN PATENT DOCUMENTS

| | | | | | |
|---|---|---|---|---|---|
| EP | 0393997 | 10/1990 | JP | 992775 | 4/1997 |
| EP | 0459493 | 12/1991 | JP | 9260568 | 10/1997 |
| EP | 0720225 | 3/1996 | JP | 9293822 | 11/1997 |
| EP | 0720234 | 3/1996 | JP | 10022447 | 1/1998 |
| EP | 0794572 A2 | 10/1997 | JP | 10199934 | 7/1998 |
| EP | 0844665 | 5/1998 | JP | 10256240 | 9/1998 |
| EP | 0989608 | 3/2000 | JP | 11307675 | 11/1999 |
| EP | 1032037 | 8/2000 | JP | 2000150765 | 5/2000 |
| JP | 55163868 | 12/1980 | JP | 20010600648 | 3/2001 |
| JP | 5745959 | 3/1982 | JP | 2002519848 | 7/2002 |
| JP | 58160096 | 8/1983 | JP | 200203497 | 8/2002 |
| JP | 59208756 | 11/1984 | JP | 2003243595 | 8/2003 |
| JP | 59227143 | 12/1984 | JP | 2004158753 | 6/2004 |
| JP | 60010756 | 1/1985 | KR | 941979 | 1/1994 |
| JP | 60116239 | 8/1985 | KR | 19940010938 | 5/1994 |
| JP | 60195957 | 10/1985 | KR | 19950018924 | 6/1995 |
| JP | 60231349 | 11/1985 | KR | 19950041844 | 11/1995 |
| JP | 6139555 | 2/1986 | KR | 19950044554 | 11/1995 |
| JP | 61248541 | 11/1986 | KR | 19950052621 | 12/1995 |
| JP | 629639 | 1/1987 | KR | 1996074111 | 12/1996 |
| JP | 6333854 | 2/1988 | KR | 9772358 | 11/1997 |
| JP | 63067762 | 3/1988 | KR | 100220154 | 6/1999 |
| JP | 63188964 | 8/1988 | KR | 20000072714 | 12/2000 |
| JP | 63205935 | 8/1988 | KR | 20000086238 | 12/2000 |
| JP | 63233555 | 9/1988 | KR | 20020049944 | 6/2002 |
| JP | 63249345 | 10/1988 | WO | EP0936671 | 8/1999 |
| JP | 63289951 | 11/1988 | WO | 9956316 | 11/1999 |
| JP | 63316470 | 12/1988 | WO | 9967821 | 12/1999 |
| JP | 64054749 | 3/1989 | | | |
| JP | 1106456 | 4/1989 | | | |
| JP | 1175250 | 7/1989 | | | |
| JP | 1205544 | 8/1989 | | | |
| JP | 1251747 | 10/1989 | | | |
| JP | 2129948 | 5/1990 | | | |
| JP | 369248 | 7/1991 | | | |
| JP | 3177060 | 8/1991 | | | |
| JP | 3289162 | 12/1991 | | | |
| JP | 4098864 | 3/1992 | | | |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

REDUCED PROFILE STACKABLE SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package wherein the conductive wires used to facilitate the electrical connection of a semiconductor die of the package to a leadframe or substrate thereof are exposed in a package body of the package to allow a mating semiconductor device or package to be mounted and electrically connected thereto.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

Even though semiconductor packages have been miniaturized, space on a printed circuit board remains limited and precious. Thus, there is a need to find a semiconductor package design to maximize the number of semiconductor packages that may be integrated into an electronic device, yet minimize the space needed to accommodate these semiconductor packages. One method to minimize space needed to accommodate the semiconductor packages is to stack the semiconductor packages on top of each other, or to stack individual semiconductor devices or other devices within the package body of the semiconductor package. In general, three-dimensional stacked packaging is a field of system-in-package (SIP) technology where semiconductor die or package stacking is used to provide a higher volume density in the thickness direction for the stacked packaging. Such three-dimensional stacked packaging enables integration of a variety of devices, including flash memories, SRAM's, DRAM's, basebands, mixed signal devices, analog devices and logic devices, and is thus essential in reducing the size, weight and price of portable electronic/communication devices. A typical three-dimensional package stack is a stack of semiconductor packages, each of which includes electrode terminals on upper and lower surfaces thereof, in the direction of thickness. In one exemplary configuration, a substrate extends a predetermined length outside an encapsulant or package body, with solder balls being formed on upper and lower surfaces of the substrate, and the overlying semiconductor package being electrically interconnected to the underlying semiconductor package by the solder balls. In some cases, an interposer having interconnection patterns is interposed between the overlying and underlying semiconductor packages to form a stack of such semiconductor packages.

However, this and other existing stacking solutions possess certain deficiencies which detract from their overall utility. In this regard, the use of the extended substrate or the additional interposer often results in electrical paths of increased length in the package stack, thus deteriorating the electrical performance of the semiconductor packages therein. Additionally, when attempting to integrate a large number of devices such as memory chips into a vertical stack within a single semiconductor package, test yield loss typically becomes higher as more such devices are assembled in a single package. As a result, it becomes desirable to use multiple packages which each contain a subset of the memory chips or devices to be integrated vertically. Further, many semiconductor package stacking approaches result in excessive increases in the area and/or thickness or the package stack, and thus are not suitable for portable electronic/communication devices that are becoming gradually lighter in weight and smaller in size and thickness. The present invention addresses these and other deficiencies, and provides a three-dimensional packaging solution wherein the individual semiconductor package(s) of the stack is/are uniquely structured to have a reduced profile, thus effectively minimizing the overall stack height of a package stack assembled to include the same. These, as well as other features and attributes of the present invention will be discussed in more detail below.

BRIEF SUMMARY OF THE INVENTION

In accordance with the present invention, there is provided multiple embodiments of a reduced profile stackable semiconductor package. The semiconductor package comprises a substrate having at least one semiconductor die attached thereto. The semiconductor die is also electrically connected to the substrate by a plurality of conductive wires. A package body defining opposed top and bottom surfaces and a side surface at least partially encapsulates the substrate, the conductive wires and the semiconductor die. The package body is formed such that at least portions of the conductive wires are exposed in the top surface thereof. The package body may include a groove formed in the top surface thereof, with at least portions of the conductive wires being exposed in the groove. In this instance, conductive material layers may be disposed within the groove and electrically connected to the exposed portions of respective ones of the conductive wires, with solder pads further bring electrically connected to respective ones of the conductive material layers and at least partially residing within the groove.

In accordance with another aspect of the present invention, there is provided various semiconductor devices or package stacks wherein two or more of the reduced profile semiconductor packages of the present invention are stacked upon and electrically connected to each other through the use of solder balls or an intervening interposer. A package stack may also be provided in accordance with the present invention comprising a reduced profile semiconductor package having a semiconductor device such as a semiconductor die stacked thereon and electrically connected thereto.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
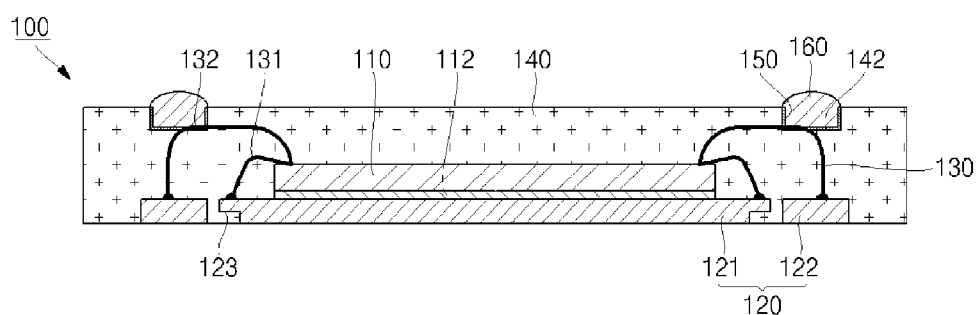
FIG. 1 is a cross-sectional view of a semiconductor package constructed in accordance with a first embodiment of the present invention.

Referring now to the drawings wherein the showings are for purposes of illustrating various embodiments of the present invention only, and not for purposes of limiting the same, FIG. 1 depicts a semiconductor package 100 constructed in accordance with a first embodiment of the present invention. The semiconductor package 100 includes a substrate which, in the semiconductor package 100, comprises a leadframe 120. The leadframe 120 itself includes a die attach pad or die pad 121. In the semiconductor package 100, the die pad 121 typically has a generally quadrangular configuration defining four peripheral edge segments. In addition, the die pad 121 defines a generally planar first (top) surface and an opposed, generally planar second (bottom) surface. In addition, as seen in FIG. 1, the die pad 121 is preferably formed to include a recessed shelf 123 which is disposed in opposed relation to the top surface thereof, and fully or partially circumvents the bottom surface thereof. The shelf 123 formed in the die pad 121 is used for reasons which will be described in more detail below.

In addition to the die pad 121, the leadframe 120 of the semiconductor package 100 comprises a plurality of leads 122. The leads 122 are preferably segregated into multiple sets, each of which extends along and in spaced relation to a respective one of the peripheral edge segments defined by the die pad 121. As a result, in the semiconductor package 100, it is contemplated that the leads 122 will substantially circumvent the die pad 121. Like the die pad 121, the leads 122 of the leadframe 120 each define a generally planar first (top) surface and an opposed, generally planar second (bottom) surface. In the leadframe 120, the top surfaces of the die pad 121 and leads 122 preferably extend in generally co-planar relation to each other. Similarly, the bottom surfaces of the die pad 121 and leads 122 preferably extend in generally co-planar relation to each other. The bottom surfaces of the die pad 121 and leads 122 of the leadframe 120 may be mounted and electrically connected to an external device as will be described in more detail below. Also, the bottom surfaces of the leads 122 may be mounted and electrically connected to the solder pads of another semiconductor device for package stacking as will also be described in more detail below. Examples of suitable materials for the leadframe 120 include, but are not limited to, copper, copper alloy, nickel iron alloys, and equivalents thereof.

In addition to the leadframe 120, the semiconductor package 100 comprises a semiconductor die 110 which is mounted to the top surface of the die pad 121 of the leadframe 120. More particularly, the semiconductor die 110 defines a generally planar first (top) surface, and an opposed, generally planar (bottom) surface. The bottom surface of the semiconductor die 110 is attached to the top surface of the die pad 121 through the use of an adhesive layer 112 in the manner shown in FIG. 1. Disposed on the top surface of the semiconductor die 110 is a plurality of conductive contacts or terminals. The semiconductor die 110 can be selected from flash memories, SRAM's, DRAM's, basebands, mixed signal devices, analog devices, logic devices, and equivalents thereof. In this regard, the present invention is not intended to be limited to any specific type of device for the semiconductor die 110.

In the semiconductor package 100, the semiconductor die 110 is electrically connected to the leadframe 120 through the use of a plurality of conductive wires 130, 131. More particularly, as seen in FIG. 1, the conductive wires 130 are used to electrically connect the contacts or terminals on the top surface of the semiconductor die 110 to the top surfaces of one or more of the leads 122. One or more conductive wires 131 are used to electrically connect one or more terminals on the top surface of the semiconductor die 110 to a peripheral portion of the top surface of the die pad 121, and in particular that portion which is disposed in opposed relation to the recessed shelf 123. It is contemplated that the conductive wires 130 will be bonded by reverse wire bonding to form the highest loop height over the leads 122 rather than over the semiconductor die 110. By reverse wire bonding, it is meant that one end of each conductive wire 130 is primarily ball-bonded to the top surface of the corresponding lead 122, with the other end thereof being secondarily stitch-bonded to the corresponding terminal on the top surface of the semiconductor die 110. As a result, the conductive wires 130 each include an upper region 132 having a high loop height, a portion of such upper region 132 being disposed opposite or above a respective one of the leads 122. It is contemplated that the conductive wires 131 may also be bonded by reverse wire bonding, though it is desirable that the loop height of the upper regions 132 of the conductive wires 130 used to electrically connect the semiconductor die 110 to the leads 122 substantially exceeds the maximum loop height of the conductive wires 131 used to electrically connect the semiconductor die 110 to the die pad 121. Further, those of ordinary skill in the art will recognize that the wire(s) 131 may be eliminated from the semiconductor package 100 without departing from the spirit and scope of the present invention. The increased loop height of the upper regions 132 of those conductive wires 130 used to electrically connect the semiconductor die 110 to the leads 122 provides advantages which will be discussed in more detail below.

In the semiconductor package 100, the semiconductor die 110, and portions of the leadframe 120 and conductive wires 130, 131 are covered by an encapsulant material which ultimately hardens into a package body 140 of the semiconductor package 100. Examples of suitable materials for the encapsulant material used to form the package body 140 include, but are not limited to, epoxy molding compounds, no-flow underfill materials and equivalents thereof. The package body 140 defines a generally planar first (top) surface, an opposed, generally planar second (bottom) surface, and generally planar side surfaces which extend generally perpendicularly between the top and bottom surfaces thereof. In the semiconductor package 100, the bottom surfaces of the die pad 121 and leads 122 of the leadframe 120 are preferably exposed in and extend in substantially flush relation to the bottom surface of the package body 140. Additionally, as seen in FIG. 1, the package body underfills the shelf 123 of the die pad 121, thus creating a firm mechanical interlock therebetween.

As seen in FIG. 1, formed in the top surface of the package body 140 is a groove 142 which may have a generally quadrangular configuration. In the semiconductor package 100, the groove 142 is formed to be of a predetermined depth, with such depth being selected so as to expose portions of the upper regions 132 of the conductive wires 130 used to electrically connect the semiconductor die 110 to the leads 122 as indicated above. It is contemplated that the groove 142 may have a generally quadrangular or semi-circular cross-sectional configuration, though the present invention is not intended to be limited to any specific shape for the groove 142. The groove 142 can be formed using a laser beam or a chemical etching solution that reacts with the encapsulant material used to form the package body 140, but does not react with the conductive wires 130, thus allowing portions of the upper regions 132 of the conductive wires 130 to be exposed in the groove 142 as indicated above. As also seen in FIG. 1, the groove 142 is preferably formed opposite to or above the leads 122 to facilitate the stacking of a plurality of semiconductor packages or devices, as will be described in more detail below as well.

In the semiconductor package 100, the groove 142 is partially lined with a plurality of conductive material layers 150, each of which is thinly formed in a prescribed region of the groove 142 as needed to facilitate the electrical connection thereof to a respective one of the conductive wires 130, and in particular to the exposed upper region 132 thereof. As seen in FIG. 1, each of the layers 150 is preferably formed so as to extend along both side walls as well as the bottom wall of the groove 142. However, it is contemplated that each layer 150 may be formed so as to cover only the bottom wall of the groove 142. Additionally, each of the layers 150 is preferably formed so as to be of sufficiently small thickness so as not to occupy an excessive amount of the internal volume of the corresponding region of the groove 142. However, it is contemplated that each layer 150 may be fully formed in the corresponding region of the groove 142, that is, such corresponding region of the groove 142 may be completely filled with the layer 150. However, in the case wherein each layer 150 is made to be of reduced thickness as shown in FIG. 1, a corresponding solder pad 160 is preferably directly formed thereon and electrically connected thereto. Thus, each solder pad 160 is electrically connected to a respective one of the conductive wires 130 via a respective one of the layers 150. As also seen in FIG. 1, each solder pad 160 is preferably formed so as to protrude slightly above the top surface of the package body 140. Though not shown, in the case where each layer 150 is fully formed in the corresponding region of the groove 142 (i.e., the corresponding region of the groove 142 is completely filled with the layer 150), it is contemplated that a solder pad 160 may still be formed on the exposed surface thereof.

It is contemplated that the conductive material used to form each of the layers 150 will comprise a conductive material that is highly adhesive to the encapsulant material used to form the package body 140. For example, the layers 150 may be formed of a material selected from conductive inks, conductive paste and equivalents thereof. In this regard, the layers 150 are adapted to serve as mediators of the package body 140 and the solder pads 160 since the solder pads 160 are not directly adhered to the package body 140. Another role for the layers 150 is to increase the electrical contact area between the wires 130 (which include the upper regions 132) and the solder pads 160 since the area of the upper regions 132 of the wires 130 exposed in the groove 142 is very small. That is, the layers 150 contribute to better interconnection between the upper regions 132 of the wires 130 and the solder pads 160. It is also contemplated that the solder pads 160 will be melt-adhered to respective ones of the layers 150 formed in the groove 142 to facilitate the electrical connection thereof to the conductive wires 130. As indicated above, the solder pads 160 protrude slightly upward from the top surface of the package body 140 to facilitate package stacking as described below. If desired, however, the solder pads 160 may lie in the same plane as the top surface of the package body 140, or may not protrude from the top surface thereof. The solder pads 160 may be made of a material selected from Sn—Pb, Sn—Ag—Cu, Sn—Ag—Bi—In, and equivalents thereof, though the present invention is not intended to be limited to any specific materials for the solder pads 160.

Figure 13:
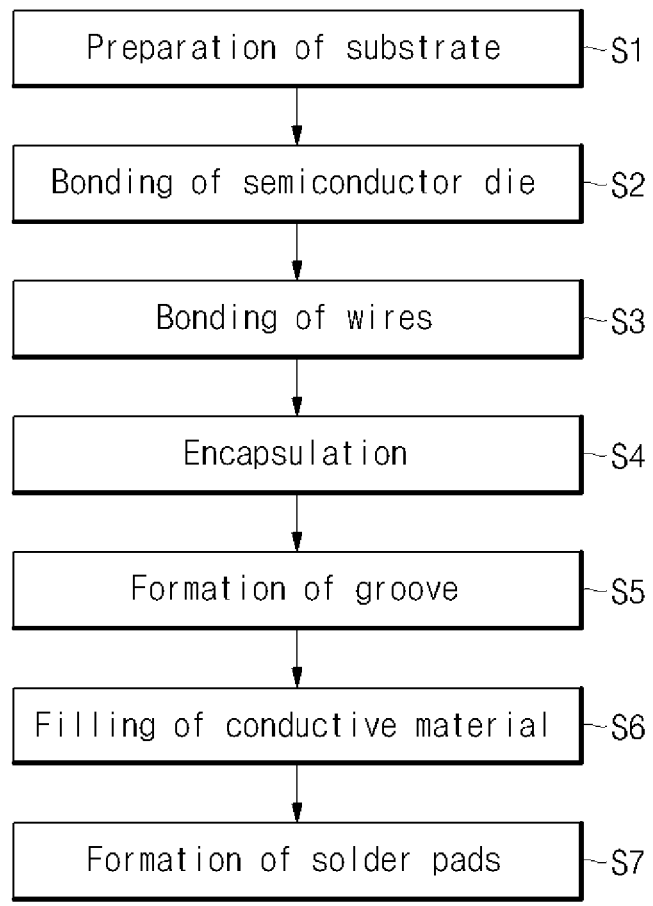
FIG. 13 is a flow chart illustrating an exemplary fabrication method for the semiconductor package shown in FIG. 1.

Referring now to FIG. 13, there is provided a flow chart which sets forth an exemplary method for fabricating the semiconductor package 100 of the present invention shown in FIG. 1. The method comprises the steps of preparing the substrate or leadframe 120 (S1), the bonding of the semiconductor die 110 to the leadframe 120 (S2), the bonding of the conductive wires 130, 131 to facilitate the electrical connection of the semiconductor die 110 to the leads 122 alone or in combination with the die pad 121 (S3), the at least partial encapsulation of the semiconductor die 110, leadframe 120 and wires 130, 131 to form the package body 140 (S4), the formation of the groove 142 in the package body 140 (S5), the partial filling of the groove 142 with the conductive material layers 150 (S6), and the formation of the solder pads 160 on respective ones of the layers 150 (S7). FIGS. 14A-14G provide illustrations corresponding to these particular steps, as will be discussed in more detail below.

Figure 14A:
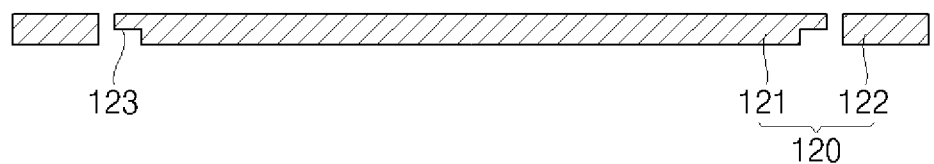
FIGS. 14A-14G are views illustrating an exemplary fabrication method for the semiconductor package shown in FIG. 1.

Referring now to FIG. 14A, in the initial step S1 of the fabrication process for the semiconductor package 100, the substrate 120 having the above-described structural attributes is provided.

Figure 14B:
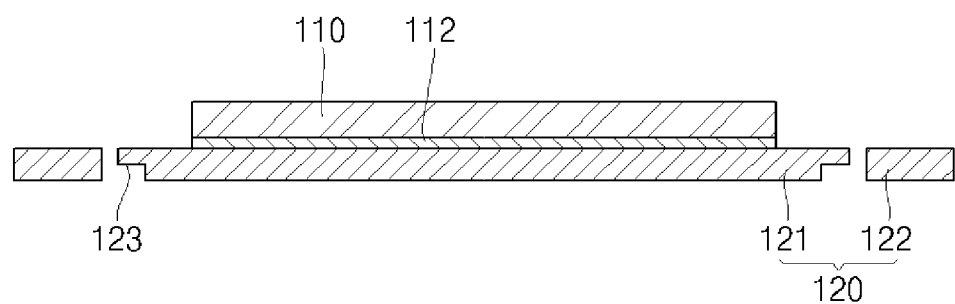

In the nest step S2 of the fabrication process for the semiconductor package 100, the semiconductor die 110 is attached to the top surface of the die pad 121 of the leadframe 120 through the use of the aforementioned adhesive layer 112 in the manner shown in FIG. 14B. The adhesive layer 112 can be selected from, but is not necessarily limited to, epoxy, adhesive tapes, adhesive films and equivalents thereof that are commonly used in the art.

Figure 14C:
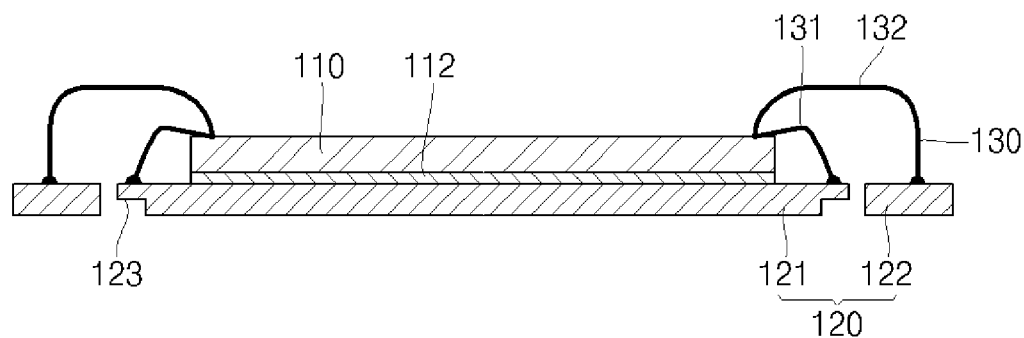

In the next step of the fabrication process for the semiconductor package 100, the semiconductor die 110, and in particular the contacts or terminals thereof, are electrically connected to the leads 122 alone or in combination with the die pad 121 through the use of the conductive wires 130 alone or in combination with the conductive wires 131, in the manner shown in FIG. 14C. As indicated above, it is contemplated that the bonding of the conductive wires 130, 131 will be facilitated by reverse wire bonding such that the conductive wires 130 are of a loop height which exceeds that of the conductive wires 131, and are further of the highest loop height over the leads 122 rather than over the semiconductor die 110. As also indicated above, by reverse wire bonding, it is meant that one end of each conductive wire 130 is primarily ball-bonded to the top surface of the corresponding lead 122, with the other end thereof being secondarily stitch-bonded to the corresponding terminal on the top surface of the semiconductor die 110.

Figure 14D:
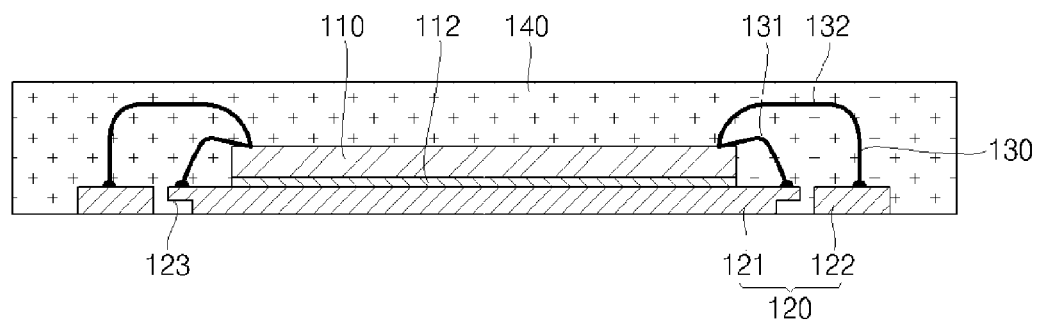

Referring now to FIG. 14D, in the next step S4 of the fabrication process for the semiconductor package 100, at least portions of the semiconductor die 110, the conductive wires 130, 131 and the leadframe 120 are each encapsulated or covered by an encapsulant material which ultimately hardens into the package body 140 of the semiconductor package 100. As indicated above, the fully formed package body 140 preferably includes opposed, generally planar top and bottom surfaces, and generally planar side surfaces which extend perpendicularly between the top and bottom surfaces thereof. Additionally, as indicated above, the package body 140 is preferably formed such that the generally planar bottom surfaces of the die pad 121 and leads 122 of the leadframe 120 are exposed in and extend in substantially flush relation to the generally planar bottom surface of the package body 140. The encapsulation step S4 can be carried out by transfer molding using a mold or dispensing molding using a dispenser.

Figure 14E:
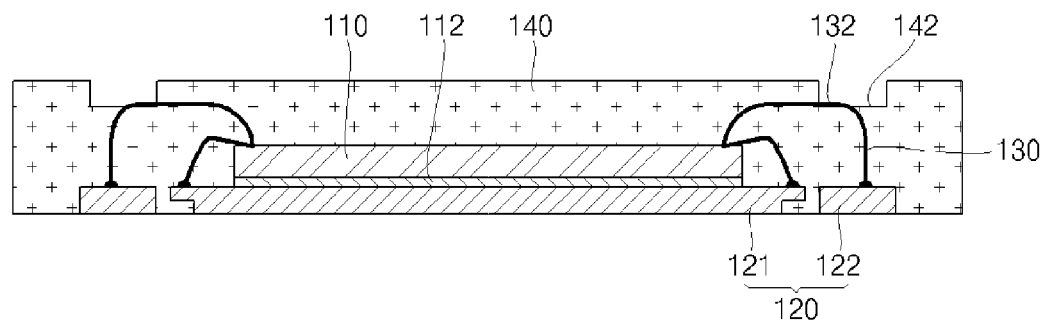

In the next step S5 of the fabrication process for the semiconductor package 100, a laser beam or a chemical etching solution is used to form the groove 142 at a predetermined depth into the generally planar top surface of the package body 140 as shown in FIG. 14E. As indicated above, the groove 142 is preferably positioned opposite to or above the leads 122, with the predetermined depth thereof being selected such that portions of the upper regions 132 of the conductive wires 130 having the highest loop height are exposed in the groove 142. As also indicated above, the laser beam or chemical etching solution used to facilitate the formation of the groove 142 reacts with the encapsulant material used to form the package body 140, but not with the conductive wires 130.

Figure 14F:
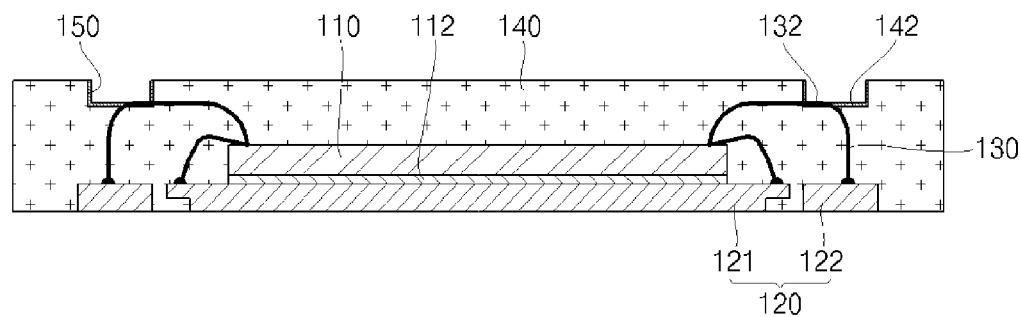

Referring now to FIG. 14F, in the next step S6 of the fabrication process for the semiconductor package 100, the above-described conductive material layers 150 are formed in the aforementioned manner so as to partially line groove 142. As previously explained, each of the layers 150 is preferably formed so as to be of sufficiently small thickness so as not to occupy an excessive amount of the internal volume of the corresponding region of the groove 142.

Figure 14G:
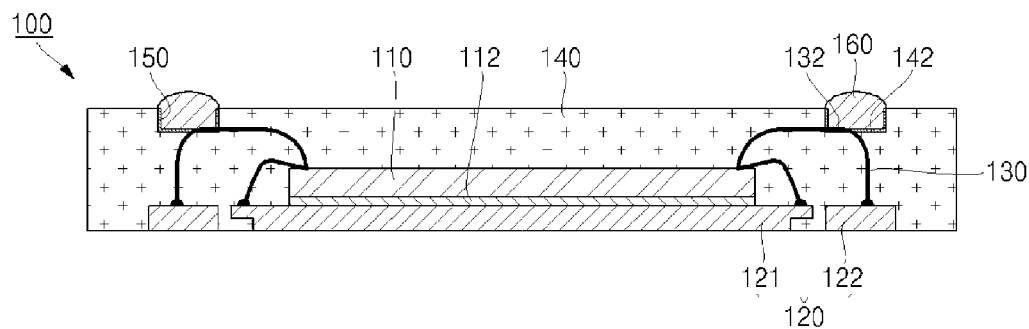

Referring now to FIG. 14G, in the final step S7 of the fabrication process for the semiconductor package 100, a solder paste is applied to each of the conductive material layers 150 formed in the groove 142. The solder paste is reflowed at high temperature and cooled to form the above-described solder pads 160 on respective ones of the layers 150, as illustrated in FIG. 14G. As indicated above, the solder pads 160 are preferably formed so as to slightly protrude beyond the generally planar top surface of the package body 140. However, the solder pads 160 may be formed so as to lie in the same plane as the top surface of the package body 140, or so as not to protrude therefrom.

Figure 2:
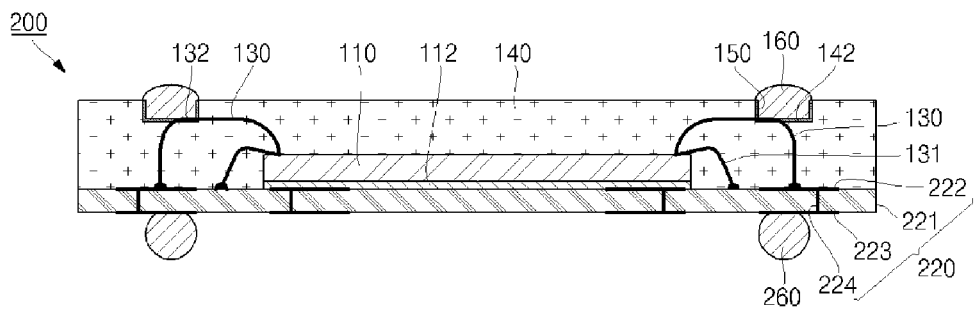
FIG. 2 is a cross-sectional view of a semiconductor package constructed in accordance with a second embodiment of the present invention.

Referring now to FIG. 2, there is shown a semiconductor package 200 constructed in accordance with a second embodiment of the present invention. The semiconductor package 200 is substantially similar to the above-described semiconductor package 100, with only the differences between the semiconductor packages 200, 100 being described below.

The sole distinction between the semiconductor packages 200, 100 lies in the substitution of the leadframe 120 described above in relation to the semiconductor package 100 with a substrate 220 in the semiconductor package 200. The substrate 220 preferably has a generally quadrangular configuration. The substrate 220 can be selected from common circuit boards (e.g., rigid circuit boards and flexible circuit boards) and equivalents thereof. In this regard, the present invention is not intended to be limited to any particular type of substrate 220. By way of example and not by way of limitation, the substrate 220 may include an insulating layer 221 having opposed, generally planar top and bottom surfaces. Disposed on the top surface is an electrically conductive pattern 222, while disposed on the bottom surface is an electrically conductive pattern 223. The conductive patterns 222, 223 are electrically interconnected to each other in a prescribed pattern or arrangement through the use of conductive vias 224 which extend through the insulation layer 221 in a direction generally perpendicularly between the top and bottom surfaces thereof. The conductive patterns 222, 223 may each be partially covered with a solder mask (not shown) for protection from the ambient environment.

The semiconductor package 200 further comprises a plurality of solder balls 260 which are electrically connected to prescribed portions of the conductive pattern 223 of the substrate 220. The solder balls 260 may be used to mount the semiconductor package 200 to an external device, or to solder pads of another semiconductor package or semiconductor device for package stacking, as will be described in more detail below. The solder balls 260 may be made of a material selected from Sn—Pb, Sn—Ag—Cu, Sn—Ag—Bi—In, and equivalents thereof, though the present invention is not intended to be limited to any particular material for the solder balls 260. In the semiconductor device 200, the groove 142 formed in the package body 140 is preferably positioned opposite to or above the solder balls 260.

Figure 3:
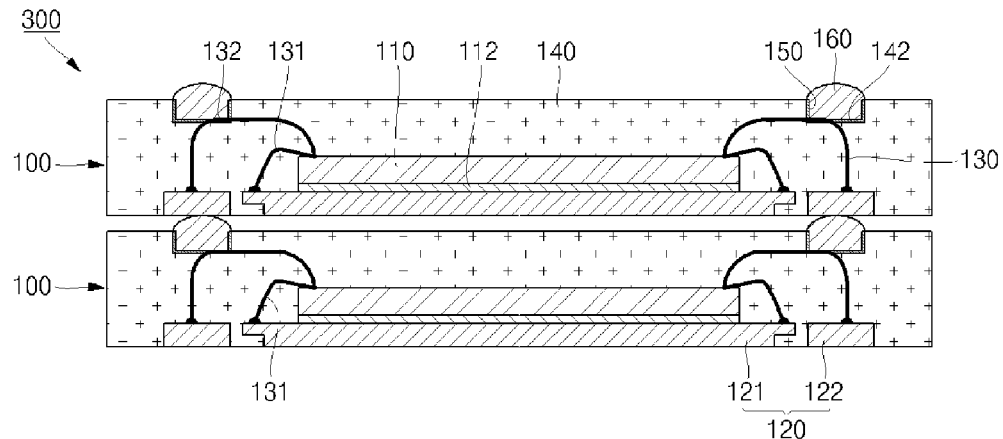
FIG. 3 is a cross-sectional view of a semiconductor device including a pair of semiconductor packages constructed in accordance with the first embodiment as arranged in a stacked configuration.

Referring now to FIG. 3, there is shown a semiconductor device 300 which comprises a stacked pair of the semiconductor packages 100 shown and described above in relation to FIG. 1. In the semiconductor device 300, the exposed bottom surfaces of the leads 122 of a top or overlying semiconductor package 100 are positioned upon and electrically connected to the exposed portions of respective ones of the solder pads 160 of a bottom or underlying semiconductor package 100. Though the semiconductor device 300 shown in FIG. 3 includes only two of the semiconductor packages 100 disposed in a stacked relationship, those of ordinary skill in the art will recognize that the semiconductor device 300 may also comprise three or more stacked semiconductor packages 100. In the semiconductor device 300, the use of the leadframes 120 having short electrical paths and relatively simple structures enables package stacking, with the semiconductor device 300 exhibiting excellent electrical performance and being capable of manufacture at a reduced cost. Though not shown, it is contemplated that a semiconductor device may be fabricated comprising a stack of two or more of the above-described semiconductor packages 200, or a combination of the semiconductor packages 100, 200.

Figure 4:
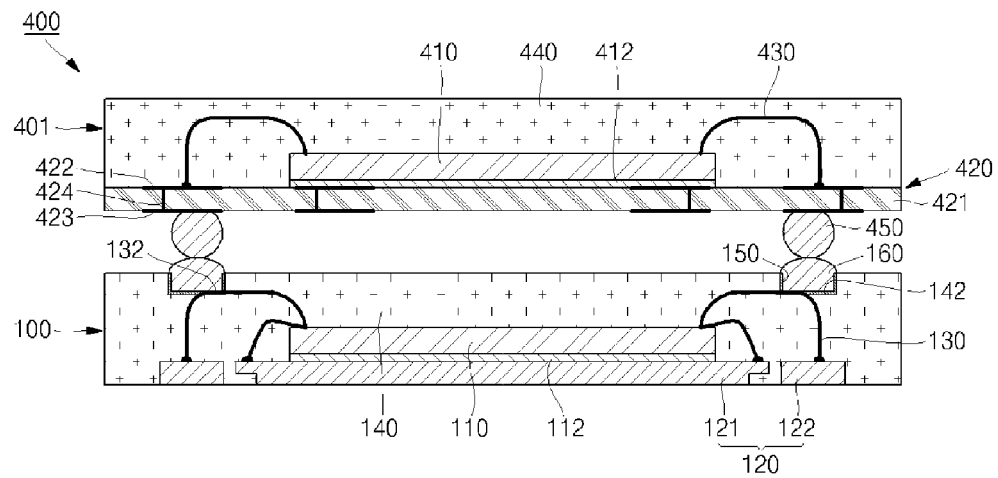
FIG. 4 is a cross-sectional view of a semiconductor device including a pair of semiconductor packages constructed in accordance with respective ones of the first and second embodiments as arranged in a stacked configuration.

Referring now to FIG. 4, there is shown a semiconductor device 400 which comprises the above-described semiconductor package 100 having a semiconductor device 401 stacked thereon and electrically connected thereto. In the semiconductor device 400, there is no restriction on the type of semiconductor device 401 which is stacked upon the semiconductor package 100. For example, the semiconductor device 401 may be a common BGA or bumped LGA semiconductor device. As shown in FIG. 4, the semiconductor device 401 is a semiconductor package comprising a substrate 420 which is identically configured to the above-described substrate 220 of the semiconductor package 200. In this regard, the substrate 420 includes an insulating layer 421 having opposed, generally planar top and bottom surfaces. Disposed on the top surface is an electrically conductive pattern 422, while disposed on the bottom surface is an electrically conductive pattern 423. The conductive patterns 422, 423 are electrically interconnected to each other in a prescribed pattern or arrangement through the use of conductive vias 424 which extend through the insulation layer 412.

The semiconductor device 401 further comprises a semiconductor die 410 which is mounted and electrically connected to the substrate 420. More particularly, the semiconductor die 410 defines opposed, generally planar top and bottom surfaces, with the bottom surface of the semiconductor die 410 being attached to the top surface of the substrate 420 through the use of an adhesive layer 412. Disposed on the top surface of the semiconductor die 410 is a plurality of conductive contacts or terminals which are electrically connected to prescribed portions of the conductive pattern 422 of the substrate 420 through the use of conductive wires 430. At least portions of the semiconductor die 410, substrate 420, and conductive wires 430 are covered by an encapsulant material which ultimately hardens into a package body 440 of the semiconductor device 401. A plurality of solder balls 450, which are identically configured to the above-described solder balls 260, are electrically connected to prescribed portions of the conductive pattern 423 of the substrate 420. As shown in FIG. 4, in the semiconductor device 400, the solder balls 450 of the semiconductor device 401 included in the stack are abutted against and electrically connected to respective ones of the solder pads 160 of the underlying semiconductor package 100.

Figure 5:
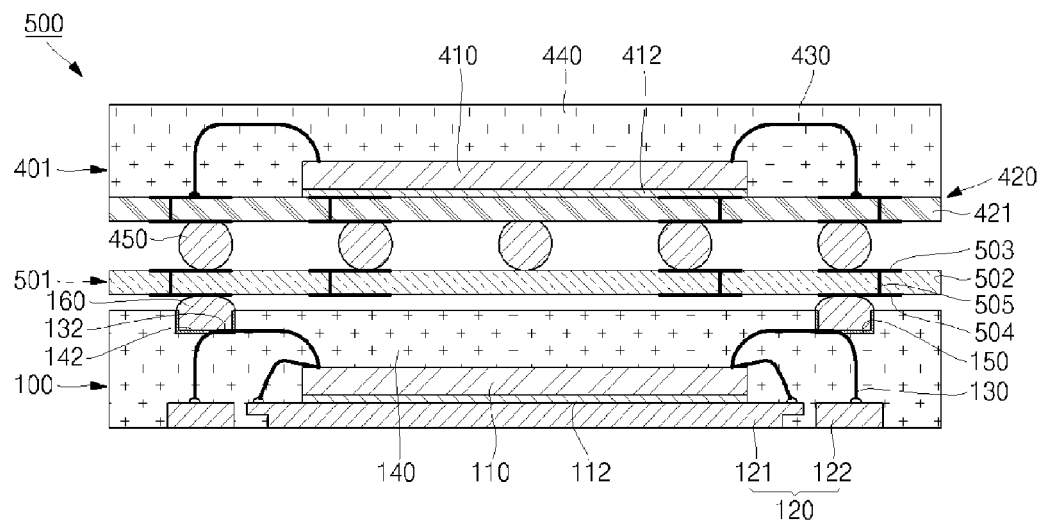
FIG. 5 is a cross-sectional view of a semiconductor device similar to that shown in FIG. 4 and including a pair of semiconductor packages constructed in accordance with respective ones of the first and second embodiments as arranged in a stacked configuration, but electrically connected to each other through the use of an intervening interposer.

Referring now to FIG. 5, there is shown a semiconductor device 500 which is substantially similar to the above-described semiconductor device 400, the sole distinction between the semiconductor devices 500, 400 lying in the use of an additional interposer 501 in the semiconductor device 500 to facilitate the electrical connection of the overlying semiconductor device 401 to the underlying semiconductor package 100. More particularly, the interposer 501 preferably has a generally quadrangular configuration, and comprises an insulating layer 502 having opposed, generally planar top and bottom surfaces. Disposed on the top surface of the insulating layer 502 is an electrically conductive pattern 503, while disposed on the bottom surface is an electrically conductive pattern 504. The conductive patterns 503, 504 are electrically interconnected to each other in a prescribed pattern or arrangement through the use of conductive vias 505 which extend through the insulation layer 502 in a direction generally perpendicularly between the top and bottom surfaces thereof. The conductive patterns 503, 504 may each be partially covered with a solder mask (not shown) for protection from the ambient environment.

In the semiconductor device 500, prescribed portions of the conductive pattern 504 are abutted against and electrically connected to the solder pads 160 of the underlying semiconductor package 100 in the manner shown in FIG. 5. The solder balls 450 of the overlying semiconductor device 401 are abutted against and electrically connected to prescribed portions of the conductive pattern 503 of the interposer 501. As such, the interposer 501 plays a role in electrically connecting the underlying semiconductor package 100 to the overlying semiconductor device 401. In this regard, although the solder pads 160 of the underlying semiconductor package 100 may be arranged in a pattern different from that of the solder balls 450 of the overlying semiconductor device 401, the semiconductor device 401 and the semiconductor package 100 may still be stacked upon each other through the use of the interposer 501. This is in contrast to the semiconductor device 400 wherein the solder balls 450 of the semiconductor device 401 and the solder pads 160 of the underlying semiconductor package 100 must be provided in similar patterns or arrangements.

Figure 6:
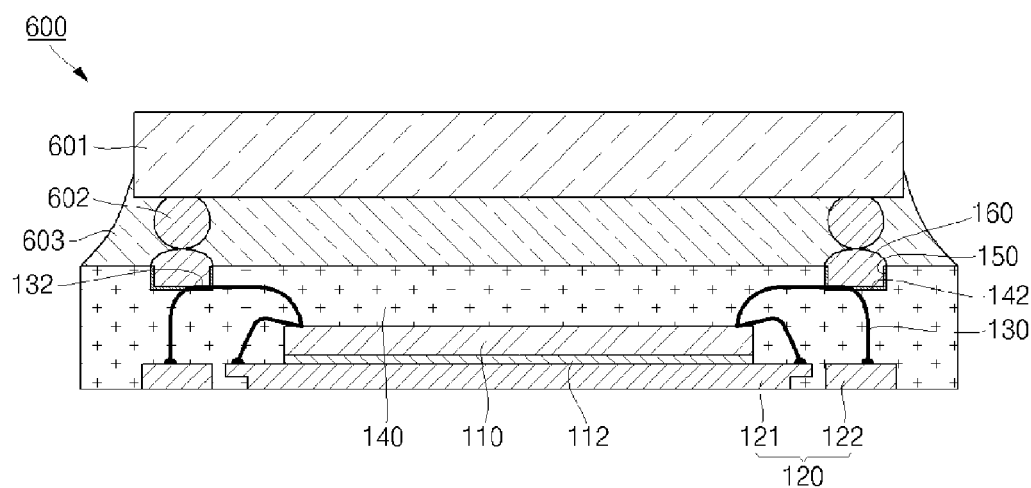
FIG. 6 is a cross-sectional view of a semiconductor device including a semiconductor package constructed in accordance with the first embodiment and a semiconductor die as arranged in a stacked configuration.

Referring now to FIG. 6, there is shown a semiconductor device 600 which comprises the above-described semiconductor package 100 having a semiconductor die 601 stacked thereon and electrically connected thereto. More particularly, as seen in FIG. 6, the semiconductor die 601 is electrically interconnected to the solder pads 160 of the underlying first semiconductor package 100 through the use of a plurality of solder balls 602, each of the solder balls 602 preferably being abutted against a respective one of the solder pads 160. An underfill material 603 is preferably filled between the underlying first semiconductor package 100 and the overlying semiconductor die 601 to firmly adhere the semiconductor die 601 to the semiconductor package 100.

Figure 7:
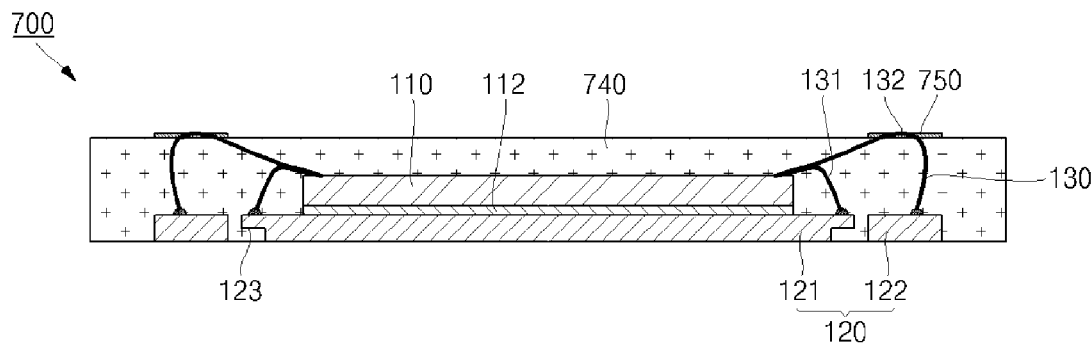
FIG. 7 is a cross-sectional view of a semiconductor package constructed in accordance with a third embodiment of the present invention.

Referring now to FIG. 7, there is shown a semiconductor package 700 constructed in accordance with a third embodiment of the present invention. The semiconductor package 700 includes a substrate which, in the semiconductor package 700, comprises the above-described leadframe 120. In addition to the leadframe 120, the semiconductor package 700 comprises the above-described semiconductor die 110 which is mounted to the top surface of the die pad 121 of the leadframe 120 through the use of the aforementioned adhesive layer 112 in the same manner set forth above in relation to the semiconductor package 100. In the semiconductor package 700, the semiconductor die 110 is electrically connected to the leadframe 120 through the use of a plurality of conductive wires 130, 131 in the same manner also set forth above in relation to the semiconductor package 100. As previously explained in relation to the semiconductor package 100, those of ordinary skill in the art will recognize that the wire(s) 131 used to electrically connect the terminals of the semiconductor die 110 to the die pad 121 of the leadframe 120 may be eliminated from the semiconductor package 700 without departing from the spirit and scope of the present invention.

In the semiconductor package 700, the semiconductor die 110, and portions of the leadframe 120 and conductive wires 130, 131 are covered by an encapsulant material which ultimately hardens into a package body 740 of the semiconductor package 700. Examples of suitable materials for the encapsulant material used to form the package body 740 include, but are not limited to, epoxy molding compounds, no-flow underfill materials and equivalents thereof. The package body 740 defines a generally planar first (top) surface, an opposed, generally planar second (bottom) surface, and generally planar side surfaces which extend generally perpendicularly between the top and bottom surfaces thereof. In the semiconductor package 700, the bottom surfaces of the die pad 121 and leads 122 of the leadframe 120 are preferably exposed in and extend in substantially flush relation to the bottom surface of the package body 740. Additionally, as seen in FIG. 7, the package body underfills the shelf 123 of the die pad 121, thus creating a firm mechanical interlock therebetween.

As seen in FIG. 7, the package body 740 of the semiconductor package 700 is preferably formed such that at least a portion of the upper region 132 of each of the conductive wires 130 is exposed in the top surface of the package body 740. The upper regions 132 having the highest loop height in the conductive wires 130, in addition to being exposed in the generally planar top surface of the package body 740, are also preferably covered with respective ones of a plurality of conductive material layers 750 which are formed on the top surface of the package body 740. The conductive material layers 750 may each have the predetermined area and, as indicated above, are electrically connected to the exposed upper regions 132 of respective ones of the conductive wires 130. With this configuration, the electrical contact area of the upper regions 132 is increased due to the formation of the layers 750 thereon, despite the very small area of the upper regions 132 which is exposed in the top surface of the package body 740. In the semiconductor package 700, there is no restriction on the material that may be used for the layers 750, with suitable materials including conductive inks, conductive pastes, and equivalents thereof. In the semiconductor package 700, the layers 750 are preferably disposed opposite to or above respective ones of the leads 122. These relative orientations are desirable for package stacking. Further, it is contemplated that the conductive wires 130 may have different loop heights, with the loop heights being adjusted to expose only a selected number of the conductive wires 130 within the top surface of the package body 740.

Figure 15:
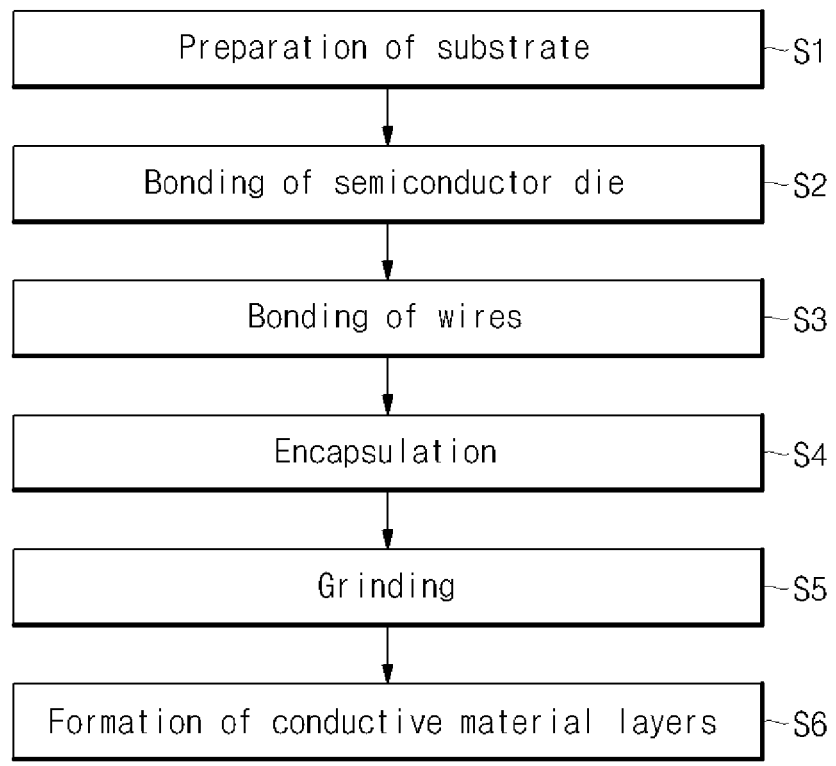
FIG. 15 is a flow chart illustrating an exemplary fabrication method for the semiconductor package shown in FIG. 7.

Referring now to FIG. 15, there is provided a flow chart which sets forth an exemplary method for fabricating the semiconductor package 700 of the present invention shown in FIG. 7. The method comprises the steps of preparing the substrate or leadframe 120 (S1), the bonding of the semiconductor die 110 to the leadframe 120 (S2), the bonding of the conductive wires 130, 131 to facilitate the electrical connection of the semiconductor die 120 to the leads 122 alone or in combination with the die pad 121 (S3), the at least partial encapsulation of the semiconductor die 110, leadframe 120 and wires 130, 131 to form the package body 740 (S4), the grinding of the package body 740 (S5), and the formation of the conductive material layers 750 on the package body 740 (S6). FIGS. 16A-16F provide illustrations corresponding to these particular steps, as will be discussed in more detail below.

Figure 16A:
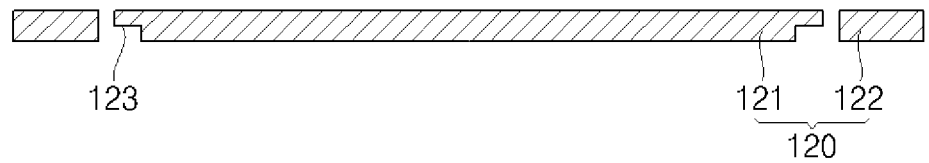
FIGS. 16A-16F are views illustrating an exemplary fabrication method for the semiconductor package shown in FIG. 7.

Referring now to FIG. 16A, in the initial step S1 of the fabrication process for the semiconductor package 700, the substrate 120 having the above-described structural attributes is provided.

Figure 16B:
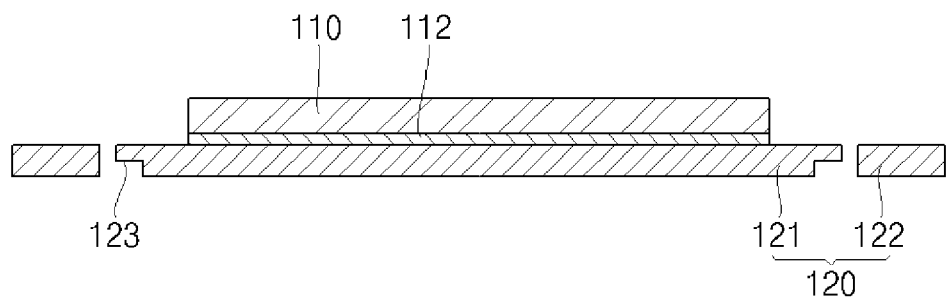

In the nest step S2 of the fabrication process for the semiconductor package 700, the semiconductor die 110 is attached to the top surface of the die pad 121 of the leadframe 120 through the use of the aforementioned adhesive layer 112 in the manner shown in FIG. 16B. The adhesive layer 112 can be selected from, but is not necessarily limited to, epoxy, adhesive tapes, adhesive films and equivalents thereof that are commonly used in the art.

Figure 16C:
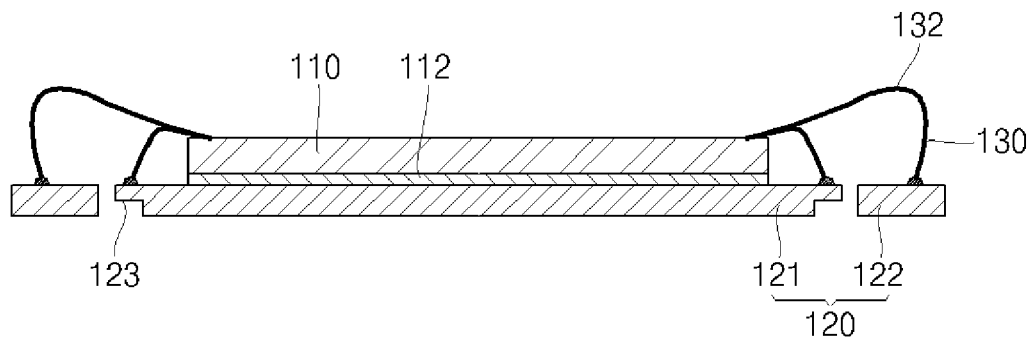

In the next step of the fabrication process for the semiconductor package 700, the semiconductor die 110, and in particular the contacts or terminals thereof, are electrically connected to the leads 122 alone or in combination with the die pad 121 through the use of the conductive wires 130 alone or in combination with the conductive wires 131, in the manner shown in FIG. 16C. As previously explained, it is contemplated that the bonding of the conductive wires 130, 131 will be facilitated by reverse wire bonding such that the conductive wires 130 are of a loop height which exceeds that of the conductive wires 131, and are further of the highest loop height over the leads 122 rather than over the semiconductor die 110. As also indicated above, by reverse wire bonding, it is meant that one end of each conductive wire 130 is primarily ball-bonded to the top surface of the corresponding lead 122, with the other end thereof being secondarily stitch-bonded to the corresponding terminal on the top surface of the semiconductor die 110.

Figure 16D:
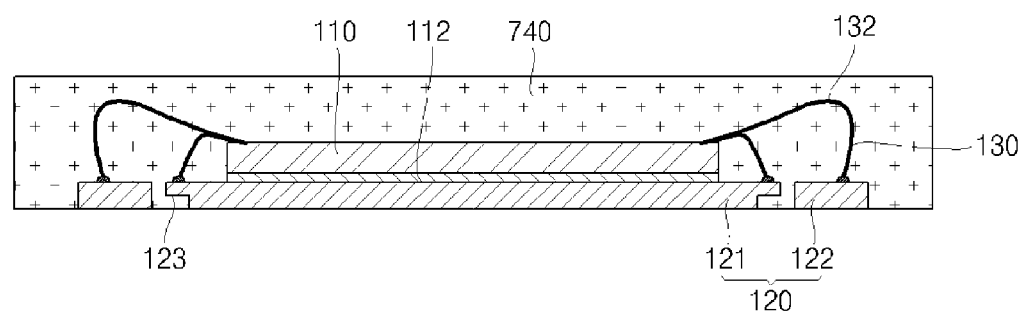

Referring now to FIG. 16D, in the next step S4 of the fabrication process for the semiconductor package 700, at least portions of the semiconductor die 110, the conductive wires 130, 131 and the leadframe 120 are each encapsulated or covered by an encapsulant material which ultimately hardens into the package body 740 of the semiconductor package 700. As indicated above, the fully formed package body 740 preferably includes opposed, generally planar top and bottom surfaces, and generally planar side surfaces which extend perpendicularly between the top and bottom surfaces thereof. Additionally, as indicated above, the package body 740 is preferably formed such that the generally planar bottom surfaces of the die pad 121 and leads 122 of the leadframe 120 are exposed in and extend in substantially flush relation to the generally planar bottom surface of the package body 740. The encapsulation step S4 can be carried out by transfer molding using a mold or dispensing molding using a dispenser.

Figure 16E:
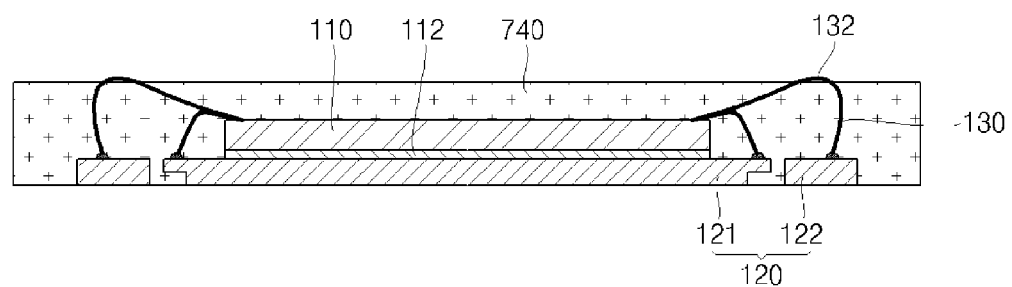

In the next step S5 of the fabrication process for the semiconductor package 700 as shown in FIG. 16E, the top surface of the package body 740 is ground to remove a predetermined thickness thereof. Specifically, the top surface of the package body 740 is ground until portions of the upper regions 132 of the conductive wires 130 are exposed in the top surface in the aforementioned manner. As a result of this grinding operation, the upper regions 132 having the highest loop height in the conductive wires 130 are exposed. As previously explained, the conductive wires 130 may have different loop heights. In this case, the loop heights of the conductive wires 130 may be selectively adjusted to expose a selected number of the conductive wires 130, and in particular the upper regions 132 thereof, in the top surface of the package body 740. It is also contemplated that the upper regions 132 of at least some of the conductive wires 130 may be exposed in the encapsulation step S4 instead of in the grinding step S5. Specifically, the encapsulation step S4 used to facilitate the formation of the package body 740 may be carried out in a manner wherein the upper regions 132 of at least some of the conductive wires 130 are in contact with a mold, such that those conductive wires 130 which contact the mold can be exposed within the top surface of the package body 740 upon the completion of the encapsulation step S4.

Figure 16F:
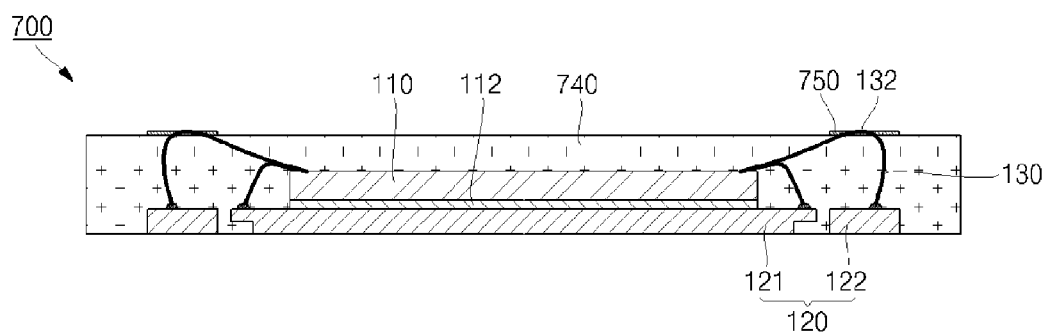

Referring now to FIG. 16F, in the final step S6 of the fabrication process for the semiconductor package 700, the above-described conductive material layers 750 are formed on the top surface of the package body 740 in the aforementioned manner. As previously explained, each of the layers 750 is electrically connected to the exposed portion of the upper region 132 of a respective one of the conductive wires 130.

Figure 8:
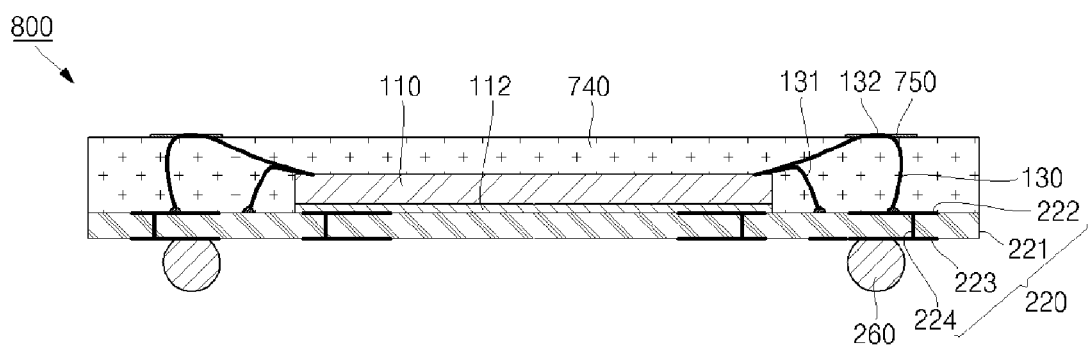
FIG. 8 is a cross-sectional view of a semiconductor package constructed in accordance with a fourth embodiment of the present invention.

Referring now to FIG. 8, there is shown a semiconductor package 800 constructed in accordance with a fourth embodiment of the present invention. The semiconductor package 800 is substantially similar to the above-described semiconductor package 700, with only the differences between the semiconductor packages 800, 700 being described below.

The sole distinction between the semiconductor packages 800, 700 lies in the substitution of the leadframe 120 described above in relation to the semiconductor package 700 with the above-described substrate 220 in the semiconductor package 800. The structural attributes of the substrate 220 are described with particularly in relation to the aforementioned semiconductor package 200.

The semiconductor package 800 further comprises a plurality of the above-described solder balls 260 which are electrically connected to prescribed portions of the conductive pattern 223 of the substrate 220. The solder balls 260 may be used to mount the semiconductor package 800 to an external device, or to solder pads of another semiconductor package or semiconductor device for package stacking, as will be described in more detail below. In the semiconductor device 800, the layers 750 are preferably positioned opposite to or above respective ones of the solder balls 260 for package stacking.

Figure 9:
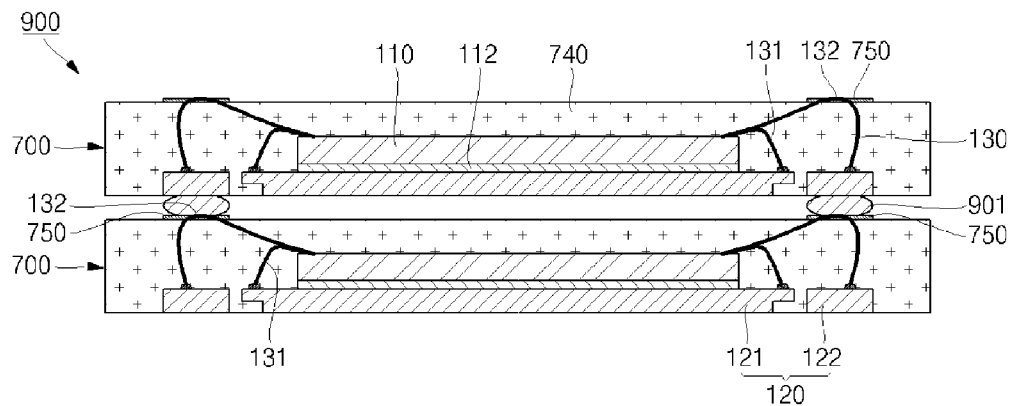
FIG. 9 is a cross-sectional view of a semiconductor device including a pair of semiconductor packages constructed in accordance with the third embodiment as arranged in a stacked configuration.

Referring now to FIG. 9, there is shown a semiconductor device 900 which comprises a stacked pair of the semiconductor packages 700 shown and described above in relation to FIG. 7. In the semiconductor device 900, the exposed bottom surfaces of the leads 122 of a top or overlying semiconductor package 700 are electrically connected to respective ones of the conductive material layers 750 of a bottom or underlying semiconductor package 700 through the use of respective ones of a plurality of conductive bumps or solder balls 901. Though the semiconductor device 900 shown in FIG. 9 includes only two of the semiconductor packages 700 disposed in a stacked relationship, those of ordinary skill in the art will recognize that the semiconductor device 900 may also comprise three or more stacked semiconductor packages 700. In the semiconductor device 900, the use of the leadframes 120 having short electrical paths and relatively simple structures enables package stacking, with the semiconductor device 900 exhibiting excellent electrical performance and being capable of manufacture at a reduced cost. Though not shown, it is contemplated that a semiconductor device may be fabricated comprising a stack of two or more of the above-described semiconductor packages 800, or a combination of the semiconductor packages 700, 800.

Figure 10:
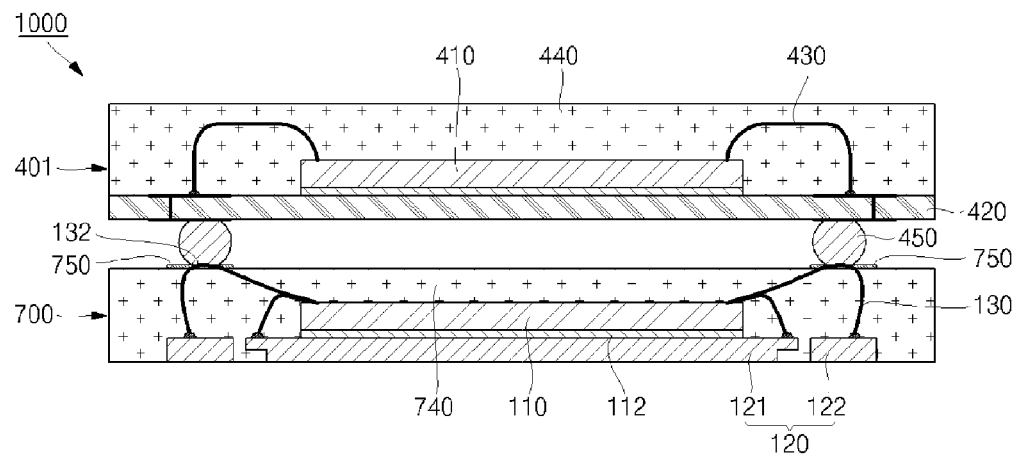
FIG. 10 is a cross-sectional view of a semiconductor device including a pair of semiconductor packages constructed in accordance with respective ones of the third and fourth embodiments as arranged in a stacked configuration.

Referring now to FIG. 10, there is shown a semiconductor device 1000 which comprises the above-described semiconductor package 700 having the above-described semiconductor device 401 stacked thereon and electrically connected thereto. As discussed above in relation to the semiconductor device 400, in the semiconductor device 1000, there is also no restriction on the type of semiconductor device 401 which is stacked upon the semiconductor package 700. For example, the semiconductor device 401 may be a common BGA or bumped LGA semiconductor device. As shown in FIG. 10, the semiconductor device 401 is a semiconductor package having the same structural attributes described above in relation to the semiconductor device 400. In the semiconductor device 1000, the solder balls 450 of the semiconductor device 401 included in the stack are abutted against and electrically connected to respective ones of the conductive material layers 750 of the underlying semiconductor package 700.

Figure 11:
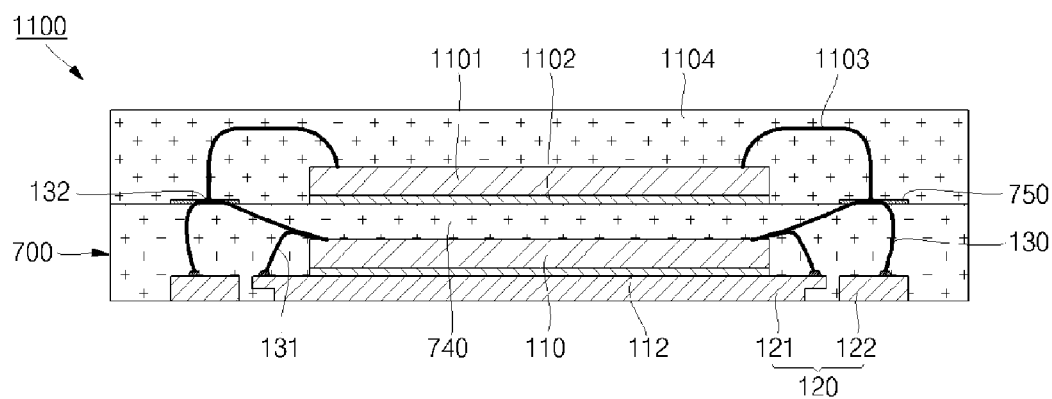
FIG. 11 is a cross-sectional view of a semiconductor device including a semiconductor package constructed in accordance with the third embodiment and a semiconductor die as arranged in a stacked configuration and electrically connected to each other through the use of conductive wires.

Referring now to FIG. 11, there is shown a semiconductor device 1100 which comprises the above-described semiconductor package 700 having a semiconductor die 1101 mounted thereon and electrically connected thereto. More particularly, as shown in FIG. 11, the semiconductor die 1101 is attached to a central area of the generally planar top surface of the package body 740 of the underlying semiconductor package 700 through the use of an adhesive layer 1102. Subsequent to such attachment, conductive contacts or terminals disposed on that surface of the semiconductor die 1101 opposite that positioned against the adhesive layer 1102 are electrically connected to the conductive material layers 750 of the semiconductor package 700 through the use of conductive wires 1103. As further shown in FIG. 11, the semiconductor die 1101, the adhesive layer 1102, the conductive wires 1103, and the top surface of the package body 740 of the underlying semiconductor package 700 (including the conductive material layers 750 formed thereon) may be covered by an encapsulant material which ultimately hardens into a secondary package body 1104. Thus, the semiconductor device 1100 has a structure in which the semiconductor dies 110, 1101 are stacked. Although only the two semiconductor dies 110, 1101 are stacked in the semiconductor device 1100 shown in FIG. 11, those of ordinary skill in the art will recognize that three or more such semiconductor dies can be stacked, if desired.

Figure 12:
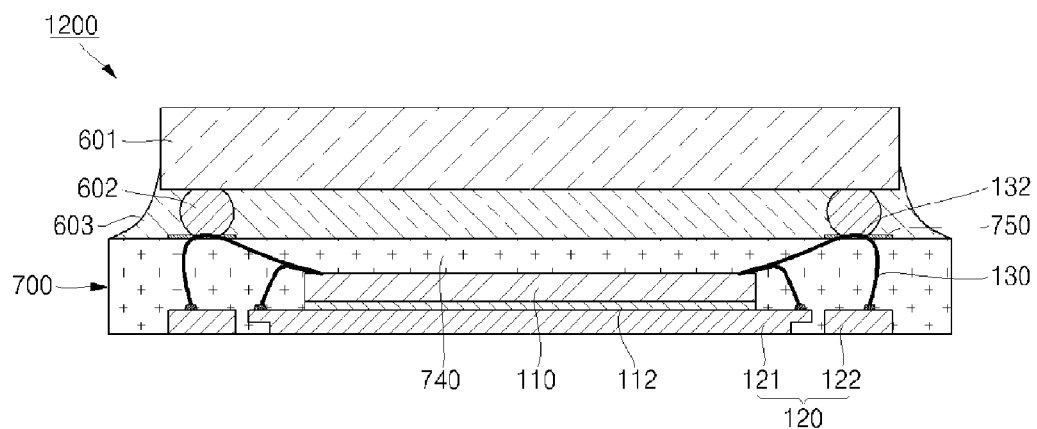
FIG. 12 is a cross-sectional view of a semiconductor device including a semiconductor package constructed in accordance with the first embodiment and a semiconductor die as arranged in a stacked configuration and electrically connected to each other through the use of conductive solder balls.

Referring now to FIG. 12, there is shown a semiconductor device 1200 which comprises the above-described semiconductor package 700 having the above-described semiconductor die 601 stacked thereon and electrically connected thereto. More particularly, as seen in FIG. 12, the semiconductor die 601 is electrically interconnected to the conductive material layers 750 of the underlying first semiconductor package 700 through the use of the aforementioned solder balls 602, each of the solder balls 602 preferably being abutted against a respective one of the layers 750. The underfill material 603 is preferably filled between the underlying first semiconductor package 700 and the overlying semiconductor die 601 to firmly adhere the semiconductor die 601 to the semiconductor package 700.

Figure 17:
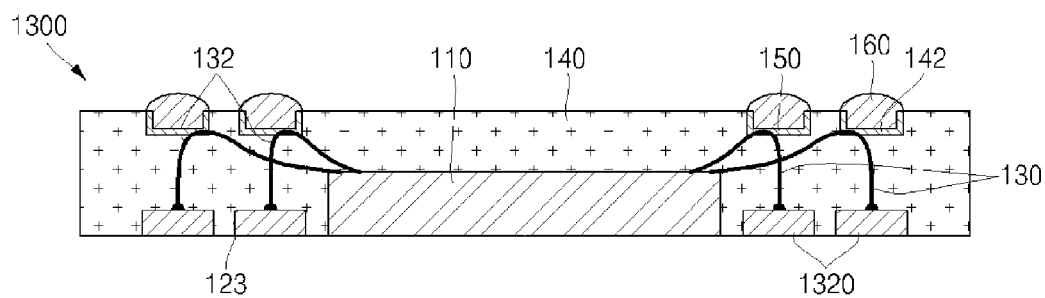
FIG. 17 is a cross-sectional view of a semiconductor package constructed in accordance with a fifth embodiment of the present invention.

Referring now to FIG. 17, there is shown a semiconductor package 1300 constructed in accordance with a fifth embodiment of the present invention. The semiconductor package 1300 comprises the above-described semiconductor die 110, the structural attributes of which are set forth above in the description of the semiconductor package 100. In addition to the semiconductor die 110, the semiconductor package 1300 includes a plurality of conductive pads 1320. As is apparent in FIG. 17, the conductive pads 1320 are preferably segregated into two sets, with each set of the conductive pads 1320 at least partially circumventing the semiconductor die 110. As further seen in FIG. 17, each of the conductive pads 1320 defines a generally planar first (top) surface, and an opposed, generally planar second (bottom) surface. The bottom surfaces of the conductive pads 1320 preferably extend in generally co-planar relation to the generally planar bottom surface of the semiconductor die 110. In the completed semiconductor package 1300, the conductive pads 1320, and in particular the bottom surfaces thereof, may be connected to another semiconductor package or semiconductor device for package stacking, as will me described in more detail below. Examples of suitable materials for the conductive pads 1320 include, but are not limited to, gold, silver, copper and equivalents thereof.

In the semiconductor package 1300, the semiconductor die 110 is electrically connected to the conductive pads 1320 through the use of a plurality of conductive wires 130. More particularly, as seen in FIG. 17, the conductive wires 130 are used to electrically connect the contacts or terminals on the top surface of the semiconductor die 110 to the top surfaces of one or more of the conductive pads 1320. It is contemplated that the conductive wires 130 will be bonded by reverse wire bonding to form the highest loop height over the conductive pads 1320 rather than over the semiconductor die 110. By reverse wire bonding, it is meant that one end of each conductive wire 130 is primarily ball-bonded to the top surface of the corresponding conductive pad 1320, with the other end thereof being secondarily stitch-bonded to the corresponding terminal on the top surface of the semiconductor die 110. As a result, the conductive wires 130 each include an upper region 132 having a high loop height, a portion of such upper region 132 being disposed opposite or above a respective one of the conductive pads 1320.

In the semiconductor package 1300, the semiconductor die 110, and portions of the conductive pads 1320 and conductive wires 130 are covered by an encapsulant material which ultimately hardens into a package body 140 of the semiconductor package 1300. Examples of suitable materials for the encapsulant material used to form the package body 140 include, but are not limited to, epoxy molding compounds, no-flow underfill materials and equivalents thereof. The package body 140 defines a generally planar first (top) surface, an opposed, generally planar second (bottom) surface, and generally planar side surfaces which extend generally perpendicularly between the top and bottom surfaces thereof. In the semiconductor package 1300, the bottom surfaces of the semiconductor die 110 and the conductive pads 1320 are preferably exposed in and extend in substantially flush relation to the bottom surface of the package body 140.

As seen in FIG. 17, formed in the top surface of the package body 140 is a spaced pair grooves 142 (i.e., and inner groove 142 and an outer groove 142) which may each have a generally quadrangular configuration. In the semiconductor package 100, the grooves 142 are formed to be of a predetermined depth, with such depth being selected so as to expose portions of the upper regions 132 of the conductive wires 130 used to electrically connect the semiconductor die 110 to the conductive pads 1320 as indicated above. It is contemplated that each groove 142 may have a generally quadrangular or semi-circular cross-sectional configuration, though the present invention is not intended to be limited to any specific shape for the grooves 142. The grooves 142 can be formed using a laser beam or a chemical etching solution that reacts with the encapsulant material used to form the package body 140, but does not react with the conductive wires 130, thus allowing portions of the upper regions 132 of the conductive wires 130 to be exposed in respective ones of the grooves 142 as indicated above. As also seen in FIG. 17, each groove 142 is preferably formed opposite to or above the conductive pads 1320 of a respective one of the sets thereof to facilitate the stacking of a plurality of semiconductor packages or devices, as will be described in more detail below as well.

In the semiconductor package 1300, each groove 142 is partially lined with a plurality of conductive material layers 150, each of which is thinly formed in a prescribed region of the corresponding groove 142 as needed to facilitate the electrical connection thereof to a respective one of the conductive wires 130, and in particular to the exposed upper region 132 thereof. As seen in FIG. 17, each of the layers 150 is preferably formed so as to extend along both side walls as well as the bottom wall of the corresponding groove 142. However, it is contemplated that each layer 150 may be formed so as to cover only the bottom wall of the corresponding groove 142. Additionally, each of the layers 150 is preferably formed so as to be of sufficiently small thickness so as not to occupy an excessive amount of the internal volume of the corresponding region of the corresponding groove 142. However, it is contemplated that each layer 150 may be fully formed in the corresponding region of the corresponding groove 142, that is, such corresponding region of the corresponding groove 142 may be completely filled with the layer 150. However, in the case wherein each layer 150 is made to be of reduced thickness as shown in FIG. 17, a corresponding solder pad 160 is preferably directly formed thereon and electrically connected thereto. Thus, each solder pad 160 is electrically connected to a respective one of the conductive wires 130 via a respective one of the layers 150. As also seen in FIG. 17, each solder pad 160 is preferably formed so as to protrude slightly above the top surface of the package body 140. Though not shown, in the case where each layer 150 is fully formed in the corresponding region of the corresponding groove 142 (i.e., the corresponding region of the corresponding groove 142 is completely filled with the layer 150), it is contemplated that a solder pad 160 may still be formed on the exposed surface thereof.

It is contemplated that the layers 150 included in the semiconductor package 1300 may be fabricated from the same materials described above in relation to the layers 150 of the semiconductor package 100. Additionally, in the semiconductor package 1300, the layers 150 provide the same structural and functional advantages described above in relation to the layers 150 included in the semiconductor package 100. Further, the solder pads 160 electrically connected to respective ones of the layers 150 are preferably fabricated from the same materials described above in relation to the solder pads 160 included in the semiconductor package 100. Though not shown, it is contemplated that the semiconductor package 1300 may be fabricated to include only one of the inner and outer sets of the conductive pads 1320, and thus only a corresponding one of the grooves 142, rather than including the inner and outer sets of the conductive pads 1320 and the inner and outer grooves 142 as shown in FIG. 17.

Figure 19:
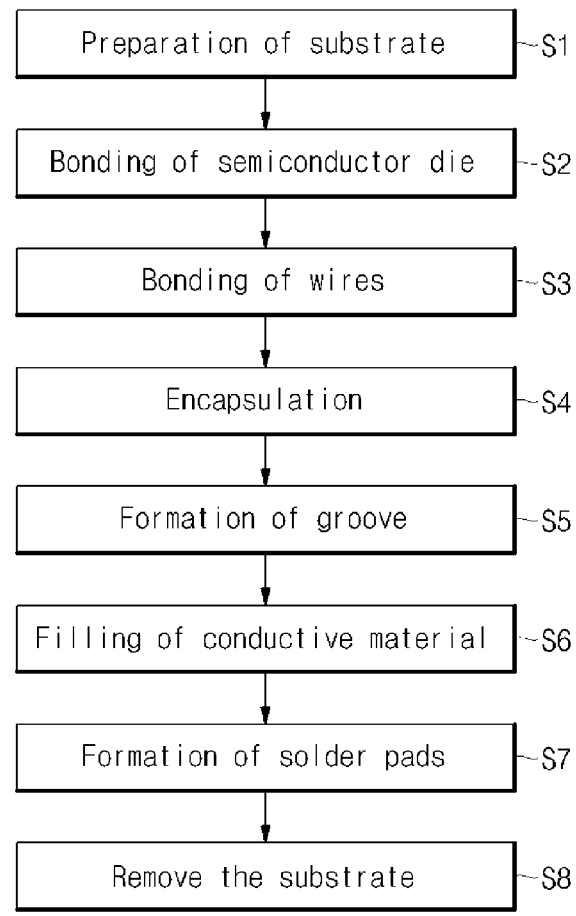
FIG. 19 is a flow chart illustrating an exemplary fabrication method for the semiconductor package shown in FIG. 17.

Referring now to FIG. 19, there is provided a flow chart which sets forth an exemplary method for fabricating the semiconductor package 1300 of the present invention shown in FIG. 17. The method comprises the steps of preparing a substrate (S1), the bonding of the semiconductor die 110 to the substrate (S2), the bonding of the conductive wires 130 to facilitate the electrical connection of the semiconductor die 110 to the conductive pads 1320 (S3), the at least partial encapsulation of the semiconductor die 110, conductive pads 1320 and wires 130 to form the package body 140 (S4), the formation of the grooves 142 in the package body 140 (S5), the partial filling of the grooves 142 with the conductive material layers 150 (S6), the formation of the solder pads 160 on respective ones of the layers 150 (S7), and the removal of the substrate from the completed semiconductor package 1300 (S8). FIGS. 20A-20H provide illustrations corresponding to these particular steps, as will be discussed in more detail below.

Figure 20A:
FIGS. 20A-20H are views illustrating an exemplary fabrication method for the semiconductor package shown in FIG. 17.

Referring now to FIG. 20A, in the initial step S1 of the fabrication process for the semiconductor package 1300, a substantially planar substrate 1310 is prepared. For example, the substrate 1310 may be any material such as, but not limited to, a nickel layer, nickel plated film, a resin film, or an equivalent thereof. The substrate 1310 defines a generally planar first (top) surface, and an opposed, generally planar second (bottom) surface. As seen in FIG. 20A, it is contemplated that a plurality of the conductive pads 1320 may previously be formed on the top surface of the substrate 1310. The conductive pads 1320 are arranged on the top surface of the substrate 1310 so as to assume the pattern or arrangement (i.e., concentric inner and outer sets) which is contemplated for the completed semiconductor package 1300. As indicated above, the conductive pads 1320 may be fabricated from any conductive materials such as, but not limited to, gold, silver, copper or equivalents thereof.

Figure 20B:
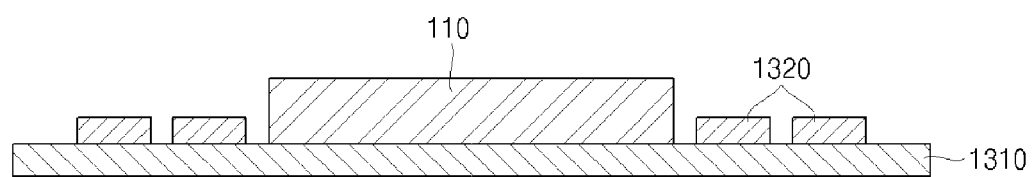

In the nest step S2 of the fabrication process for the semiconductor package 1300, the semiconductor die 110 is attached to the top surface of the substrate 1310 in the manner shown in FIG. 20B. The semiconductor die 110 is preferably positioned on the top surface of the substrate 1310 such that it is at least partially circumvented by the inner and outer sets of the conductive pads 1320.

Figure 20C:
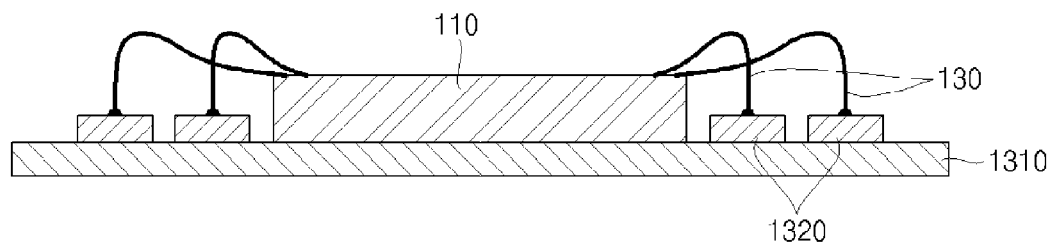

In the next step of the fabrication process for the semiconductor package 1300, the semiconductor die 110, and in particular the contacts or terminals thereof, are electrically connected to the conductive pads 1320 through the use of the conductive wires 130, in the manner shown in FIG. 20C. As indicated above, it is contemplated that the bonding of the conductive wires 130 will be facilitated by reverse wire bonding such that the conductive wires 130 are of the highest loop height over the conductive pads 1320 rather than over the semiconductor die 110. As also indicated above, by reverse wire bonding, it is meant that one end of each conductive wire 130 is primarily ball-bonded to the top surface of the corresponding conductive pad 1320, with the other end thereof being secondarily stitch-bonded to the corresponding terminal on the top surface of the semiconductor die 110.

Figure 20D:
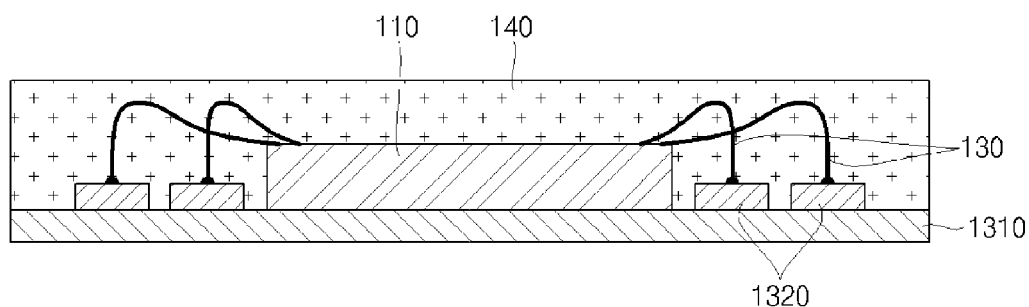

Referring now to FIG. 20D, in the next step S4 of the fabrication process for the semiconductor package 1300, at least portions of the semiconductor die 110, the conductive wires 130 and the top surface of the substrate 1310 are each encapsulated or covered by an encapsulant material which ultimately hardens into the package body 140 of the semiconductor package 1300. As indicated above, the fully formed package body 140 preferably includes opposed, generally planar top and bottom surfaces, and generally planar side surfaces which extend perpendicularly between the top and bottom surfaces thereof.

Figure 20E:
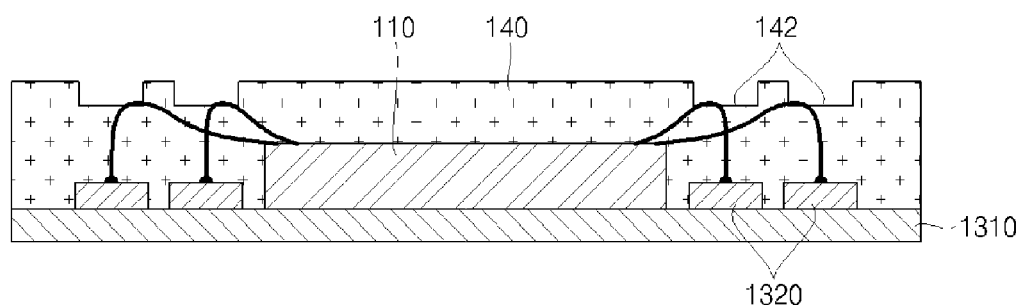

In the next step S5 of the fabrication process for the semiconductor package 1300, a laser beam or a chemical etching solution is used to form the grooves 142 at predetermined depths into the generally planar top surface of the package body 140 as shown in FIG. 20E. As indicated above, each groove 142 is preferably positioned opposite to or above a respective set of the conductive pads 1320, with the predetermined depths of the grooves 142 being selected such that portions of the upper regions 132 of the conductive wires 130 having the highest loop height are exposed therein. As also indicated above, the laser beam or chemical etching solution used to facilitate the formation of the grooves 142 reacts with the encapsulant material used to form the package body 140, but not with the conductive wires 130.

Figure 20F:
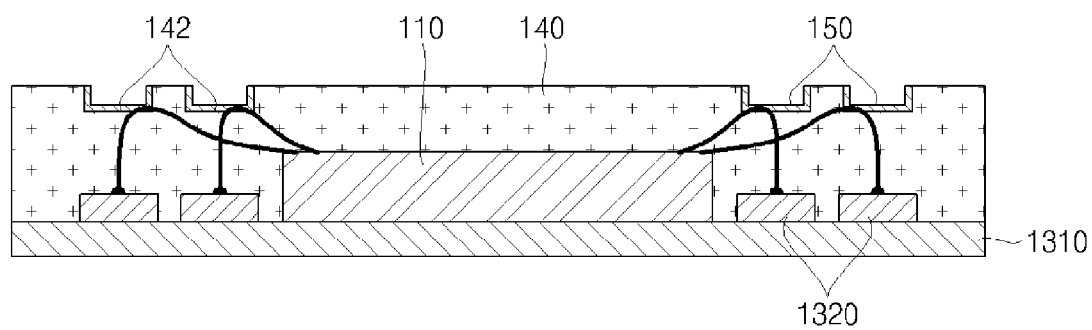

Referring now to FIG. 20F, in the next step S6 of the fabrication process for the semiconductor package 1300, the above-described conductive material layers 150 are formed in the aforementioned manner so as to partially line the grooves 142. As previously explained, each of the layers 150 is preferably formed so as to be sufficiently small thickness so as not to occupy an excessive amount of the internal volume of the corresponding region of the corresponding groove 142.

Figure 20G:
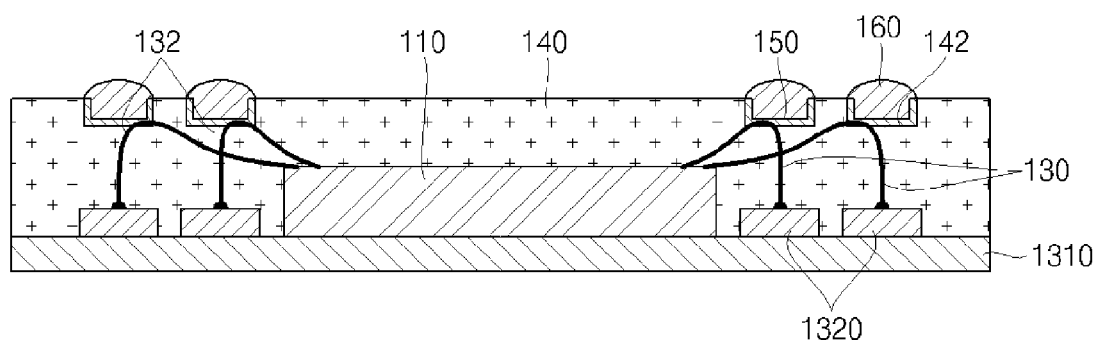

Referring now to FIG. 20G, in the next step S7 of the fabrication process for the semiconductor package 1300, a solder paste is applied to each of the conductive material layers 150 formed in the grooves 142. The solder paste is reflowed at high temperature and cooled to form the above-described solder pads 160 on respective ones of the layers 150, as illustrated in FIG. 20G. As indicated above, the solder pads 160 are preferably formed so as to slightly protrude beyond the generally planar top surface of the package body 140. However, the solder pads 160 may be formed so as to lie in the same plane as the top surface of the package body 140, or so as not to protrude therefrom.

Figure 20H:
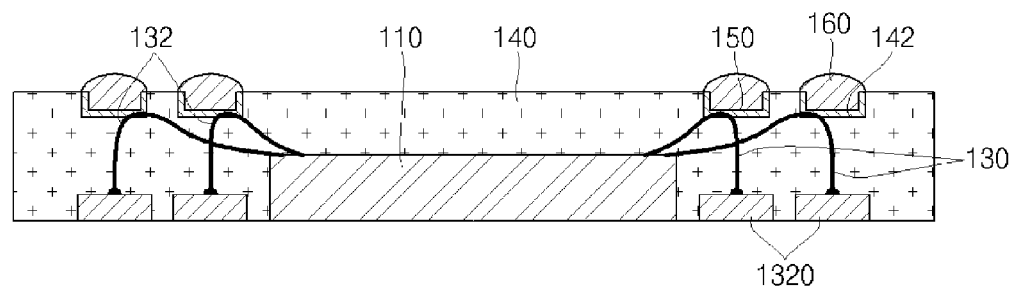

Referring now to FIG. 20H, in the final step S8 of the fabrication process for the semiconductor package 1300, the substrate 1310 is removed from the package body 140. For example, the substrate 1310 may be removed by using chemical etching or mechanical polishing. The package body 140 is formed such that, upon the removal of the substrate 1310, the generally planar bottom surfaces of the semiconductor die 110 and the conductive pads 1320 are exposed in and extend in substantially flush relation to the generally planar bottom surface of the package body 140.

Figure 18:
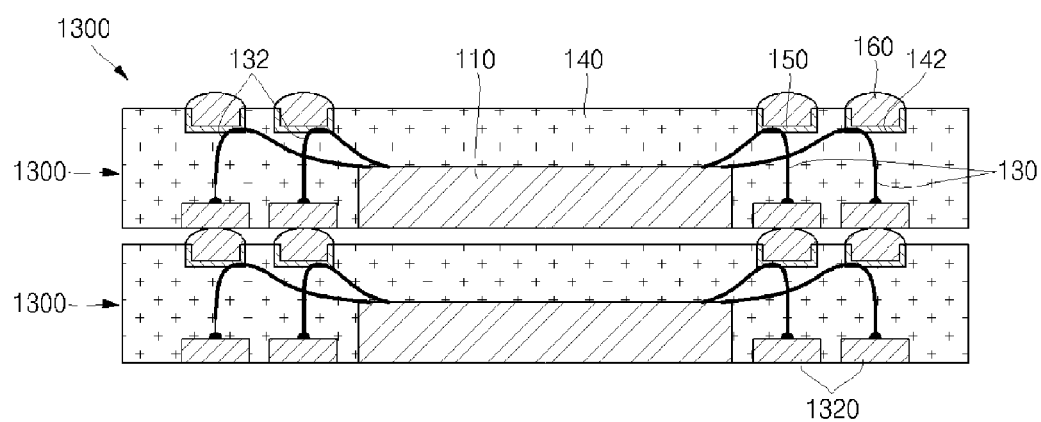
FIG. 18 is a cross-sectional view of a semiconductor device including a pair of semiconductor packages constructed in accordance with the fifth embodiment as arranged in a stacked configuration.

Referring now to FIG. 18, there is shown a semiconductor device 1400 which comprises a stacked pair of the semiconductor packages 1300 shown and described above in relation to FIG. 17. In the semiconductor device 1400, the exposed bottom surfaces of the conductive pads 1320 of a top or overlying semiconductor package 1300 are positioned upon and electrically connected to the exposed portions of respective ones of the solder pads 160 of a bottom or underlying semiconductor package 1300. Though the semiconductor device 1400 shown in FIG. 18 includes only two of the semiconductor packages 1300 disposed in a stacked relationship, those of ordinary skill in the art will recognize that the semiconductor device 1400 may also comprise three or more stacked semiconductor packages 1300.

Figure 21:
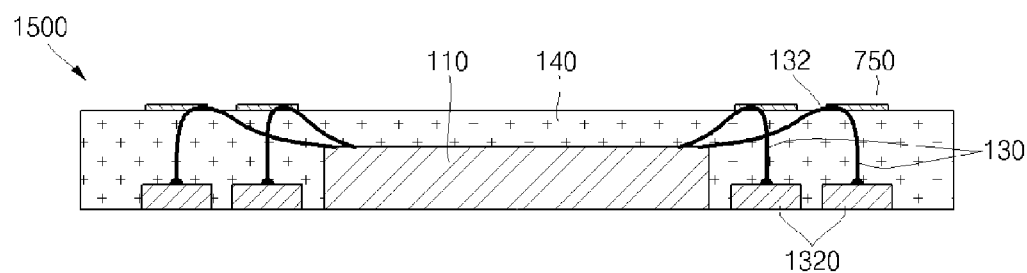
FIG. 21 is a cross-sectional view of a semiconductor package constructed in accordance with a sixth embodiment of the present invention.

Referring now to FIG. 21, there is shown a semiconductor package 1500 constructed in accordance with a sixth embodiment of the present invention. The semiconductor package 1500 includes the semiconductor die 110 and conductive pads 1320 which are formed from the same materials and arranged in the same relative orientations to each other as described above in relation to the semiconductor package 1400 shown in FIG. 17. Additionally, in the semiconductor package 1500, conductive wires 130 including upper regions 132 are used to electrically connect the terminals of the semiconductor die 110 to the conductive pads 1320 in the same manner described above in relation to the semiconductor package 1400.

In the semiconductor package 1500, the semiconductor die 110, and portions of the conductive pads 1320 and conductive wires 130 are covered by an encapsulant material which ultimately hardens into a package body 140 of the semiconductor package 1500. Examples of suitable materials for the encapsulant material used to form the package body 140 include, but are not limited to, epoxy molding compounds, no-flow underfill materials and equivalents thereof. The package body 140 defines a generally planar first (top) surface, an opposed, generally planar second (bottom) surface, and generally planar side surfaces which extend generally perpendicularly between the top and bottom surfaces thereof. In the semiconductor package 1500, the bottom surfaces of the semiconductor die 110 and the conductive pads 1320 are preferably exposed in and extend in substantially flush relation to the bottom surface of the package body 140.

As seen in FIG. 21, the package body 140 of the semiconductor package 1500 is preferably formed such that at least a portion of the upper region 132 of each of the conductive wires 130 is exposed in the top surface of the package body 140. The upper regions 132 having the highest loop height in the conductive wires 130, in addition to being exposed in the generally planar top surface of the package body 740, are also preferably covered with respective ones of a plurality of conductive material layers 750 which are formed on the top surface of the package body 140. The conductive material layers 750 may each have the predetermined area and, as indicated above, are electrically connected to the exposed upper regions 132 of respective ones of the conductive wires 130. With this configuration, the electrical contact area of the upper regions 132 is increased due to the formation of the layers 750 thereon, despite the very small area of the upper regions 132 which is exposed in the top surface of the package body 140. In the semiconductor package 1500, there is no restriction on the material that may be used for the layers 750, with suitable materials including conductive inks, conductive pastes, and equivalents thereof. In the semiconductor package 1500, the layers 750 are preferably disposed opposite to or above respective ones of the conductive pads 1320. Thus, if the conductive pads 1320 are arranged in the semiconductor package 1500 as concentric inner and outer sets which circumvent the semiconductor die 110, the layers 750 will likewise be arranged in the semiconductor package 1500 as concentric inner and outer sets. These relative orientations are desirable for package stacking. Further, it is contemplated that the conductive wires 130 may have different loop heights, with the loop heights being adjusted to expose only a selected number of the conductive wires 130 within the top surface of the package body 140.

Figure 23:
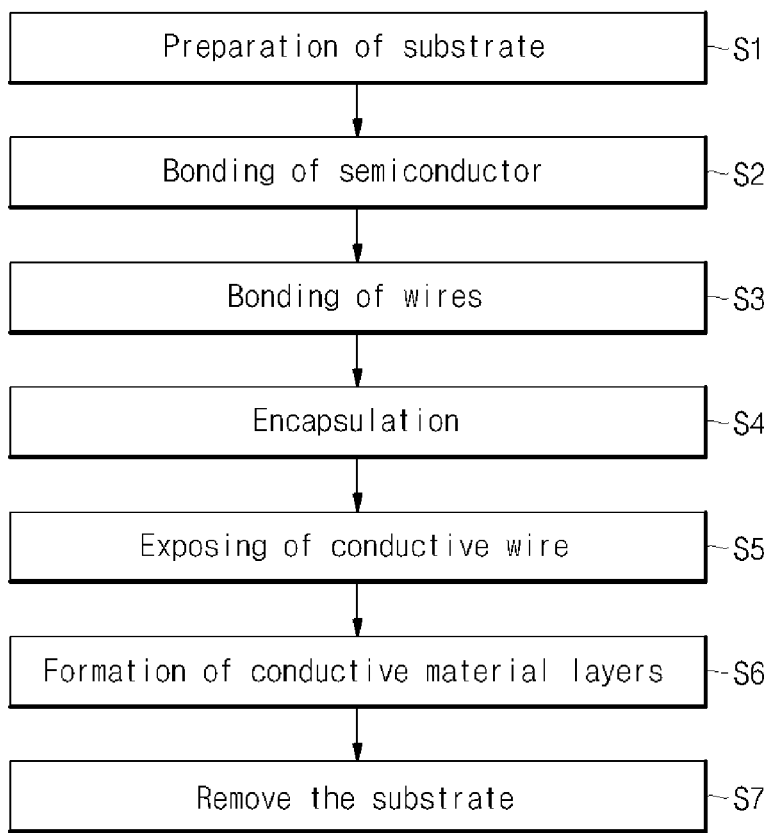
FIG. 23 is a flow chart illustrating an exemplary fabrication method for the semiconductor package shown in FIG. 21.

Referring now to FIG. 23, there is provided a flow chart which sets forth an exemplary method for fabricating the semiconductor package 1500 of the present invention shown in FIG. 21. The method comprises the steps of preparing a substrate (S1), the bonding of the semiconductor die 110 to the substrate (S2), the bonding of the conductive wires 130 to facilitate the electrical connection of the semiconductor die 110 to the conductive pads 1320 (S3), the at least partial encapsulation of the semiconductor die 110, conductive pads 1320 and wires 130 to form the package body 140 (S4), the exposure of the conductive wires 130 (S5), the formation of the conductive material layers 750 on the package body 140 (S6), and the removal of the substrate from the completed semiconductor package 1500 (S7). FIGS. 24A-24G provide illustrations corresponding to these particular steps, as will be discussed in more detail below.

Figure 24A:
FIGS. 24A-24G are views illustrating an exemplary fabrication method for the semiconductor package shown in FIG. 21.

Referring now to FIG. 24A, in the initial step S1 of the fabrication process for the semiconductor package 1500, a substantially planar substrate 1310 is prepared. For example, the substrate 1310 may be any material such as, but not limited to, a nickel layer, nickel plated film, a resin film, or an equivalent thereof. The substrate 1310 defines a generally planar first (top) surface, and an opposed, generally planar second (bottom) surface. As seen in FIG. 24A, it is contemplated that a plurality of the conductive pads 1320 may previously be formed on the top surface of the substrate 1310. The conductive pads 1320 are arranged on the top surface of the substrate 1310 so as to assume the pattern or arrangement (i.e., concentric inner and outer sets) which is contemplated for the completed semiconductor package 1500. As indicated above, the conductive pads 1320 may be fabricated from any conductive materials such as, but not limited to, gold, silver, copper or equivalents thereof.

Figure 24B:
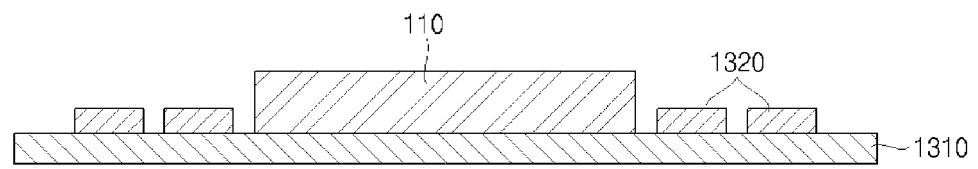

In the nest step S2 of the fabrication process for the semiconductor package 1500, the semiconductor die 110 is attached to the top surface of the substrate 1310 in the manner shown in FIG. 24B. The semiconductor die 110 is preferably positioned on the top surface of the substrate 1310 such that it is at least partially circumvented by the inner and outer sets of the conductive pads 1320.

Figure 24C:
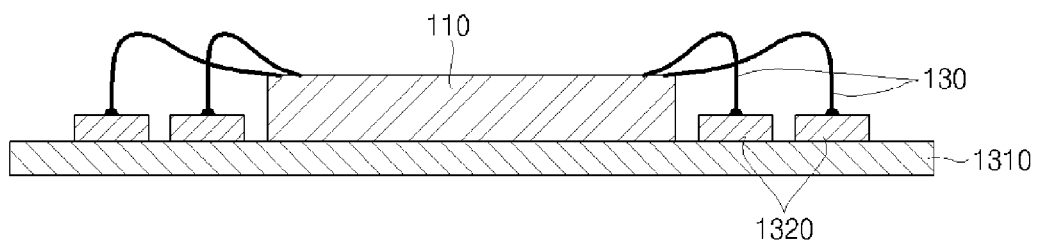

In the next step of the fabrication process for the semiconductor package 1500, the semiconductor die 110, and in particular the contacts or terminals thereof, are electrically connected to the conductive pads 1320 through the use of the conductive wires 130, in the manner shown in FIG. 24C. As indicated above, it is contemplated that the bonding of the conductive wires 130 will be facilitated by reverse wire bonding such that the conductive wires 130 are of the highest loop height over the conductive pads 1320 rather than over the semiconductor die 110. As also indicated above, by reverse wire bonding, it is meant that one end of each conductive wire 130 is primarily ball-bonded to the top surface of the corresponding conductive pad 1320, with the other end thereof being secondarily stitch-bonded to the corresponding terminal on the top surface of the semiconductor die 110.

Figure 24D:
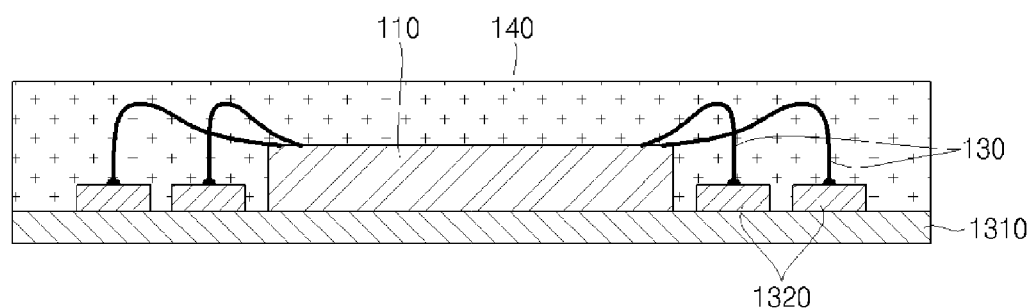

Referring now to FIG. 24D, in the next step S4 of the fabrication process for the semiconductor package 1500, at least portions of the semiconductor die 110, the conductive wires 130 and the top surface of the substrate 1310 are each encapsulated or covered by an encapsulant material which ultimately hardens into the package body 140 of the semiconductor package 1300. As indicated above, the fully formed package body 140 preferably includes opposed, generally planar top and bottom surfaces, and generally planar side surfaces which extend perpendicularly between the top and bottom surfaces thereof.

Figure 24E:
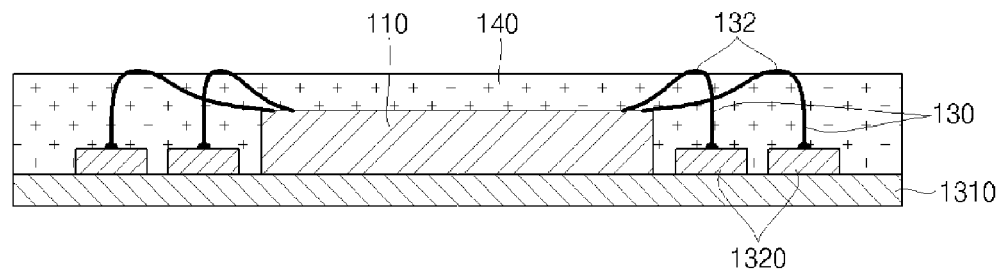

In the next step S5 of the fabrication process for the semiconductor package 1500 as shown in FIG. 24E, the top surface of the package body 140 is ground to remove a predetermined thickness thereof. Specifically, the top surface of the package body 140 is ground until portions of the upper regions 132 of the conductive wires 130 are exposed in the top surface in the aforementioned manner. As a result of this grinding operation, the upper regions 132 having the highest loop height in the conductive wires 130 are exposed. As previously explained, the conductive wires 130 may have different loop heights. In this case, the loop heights of the conductive wires 130 may be selectively adjusted to expose a selected number of the conductive wires 130, and in particular the upper regions 132 thereof, in the top surface of the package body 140. It is also contemplated that the upper regions 132 of at least some of the conductive wires 130 may be exposed in the encapsulation step S4 instead of in the grinding step S5. Specifically, the encapsulation step S4 used to facilitate the formation of the package body 140 may be carried out in a manner wherein the upper regions 132 of at least some of the conductive wires 130 are in contact with a mold, such that those conductive wires 130 which contact the mold can be exposed within the top surface of the package body 140 upon the completion of the encapsulation step S4.

Figure 24F:
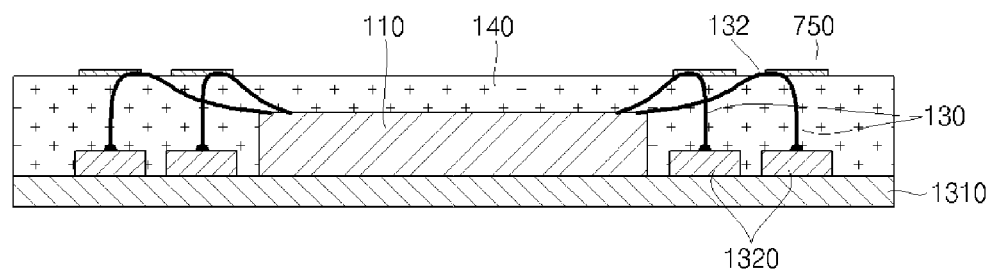

Referring now to FIG. 24F, in the next step S6 of the fabrication process for the semiconductor package 1500, the above-described conductive material layers 750 are formed on the top surface of the package body 740 in the aforementioned manner. As previously explained, each of the layers 750 is electrically connected to the exposed portion of the upper region 132 of a respective one of the conductive wires 130.

Figure 24G:
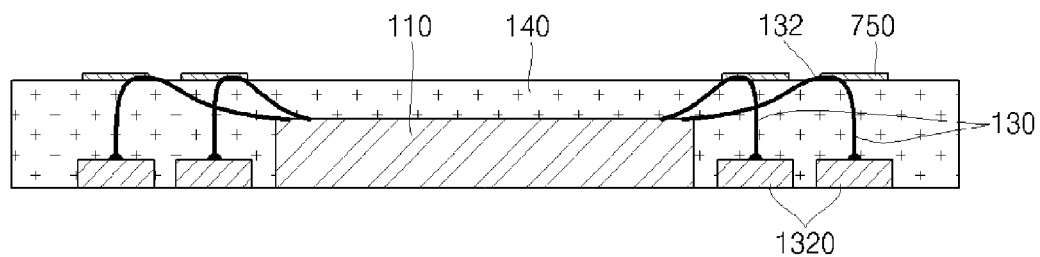

Referring now to FIG. 24G, in the final step S8 of the fabrication process for the semiconductor package 1500, the substrate 1310 is removed from the package body 140. For example, the substrate 1310 may be removed by using chemical etching or mechanical polishing. The package body 140 is formed such that, upon the removal of the substrate 1310, the generally planar bottom surfaces of the semiconductor die 110 and the conductive pads 1320 are exposed in and extend in substantially flush relation to the generally planar bottom surface of the package body 140.

Figure 22:
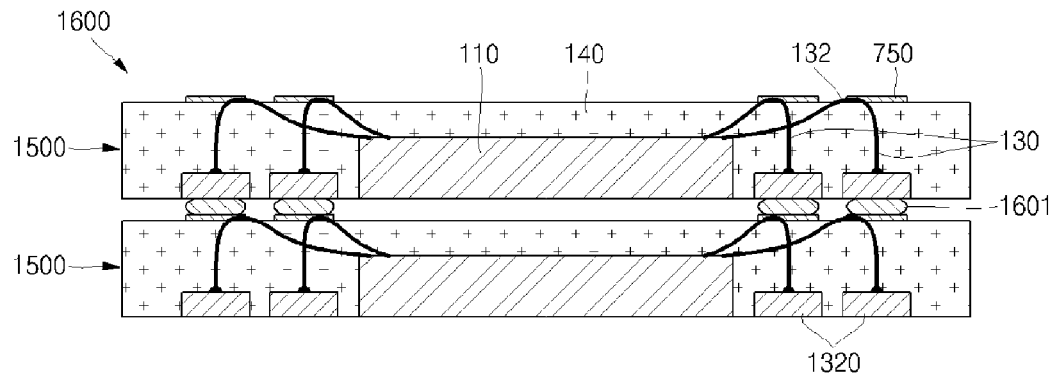
FIG. 22 is a cross-sectional view of a semiconductor device including a pair of semiconductor packages constructed in accordance with the sixth embodiment as arranged in a stacked configuration.

Referring now to FIG. 22, there is shown a semiconductor device 1600 which comprises a stacked pair of the semiconductor packages 1500 shown and described above in relation to FIG. 21. In the semiconductor device 1600, the exposed bottom surfaces of the conductive pads 1320 of a top or overlying semiconductor package 1500 are electrically connected to respective ones of the conductive material layers 750 of a bottom or underlying semiconductor package 1500 through the use of respective ones of a plurality of conductive bumps or solder balls 1601. Though the semiconductor device 1600 shown in FIG. 22 includes only two of the semiconductor packages 1500 disposed in a stacked relationship, those of ordinary skill in the art will recognize that the semiconductor device 1600 may also comprise three or more stacked semiconductor packages 1500.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a substrate;
   at least one semiconductor die attached to the substrate and electrically connected thereto by at least one conductive wire; and
   a package body defining a generally planar top surface, a bottom surface, and a side surface, the package body at least partially encapsulating the substrate, the conductive wire and the semiconductor die, and being formed such that at least a portion of the conductive wire is exposed in the top surface thereof.

2. The semiconductor package of claim 1 further comprising a conductive material layer disposed on the top surface of the package body and electrically connected to the exposed portion of the conductive wire.

3. The semiconductor package of claim 2 wherein:
   the semiconductor die is electrically connected to the substrate by a plurality of conductive wires, each of which includes a portion which is exposed in the top surface of the package body; and
   a plurality of conductive material layers are disposed on the top surface of the package body and electrically connected to the exposed portions of respective ones of the conductive wires.

4. The semiconductor package of claim 3 further in combination with a semiconductor device which is stacked upon the semiconductor package and electrically connected to the conductive material layers thereof.

5. The semiconductor package of claim 4 wherein the semiconductor device stacked upon and electrically connected to the semiconductor package comprises one of another semiconductor package and a semiconductor die.

6. The semiconductor package of claim 5 wherein the semiconductor device comprises a second semiconductor package which is identically configured to the semiconductor package, the second semiconductor package being electrically connected to the conductive material layers of the semiconductor package.

7. The semiconductor package of claim 1 wherein the substrate comprises a leadframe including:
   a die pad defining opposed top and bottom pad surfaces; and
   a plurality of leads which each define opposed top and bottom lead surfaces and extend at least partially about the die pad in spaced relation thereto;

the semiconductor die being attached to the top pad surface of the die pad and electrically connected to at least some the leads by a plurality of the conductive wires, each of which includes a portion which is exposed in the top surface of the package body which is formed such that that the bottom pad surfaces and the bottom lead surfaces are exposed therein.

8. The semiconductor package of claim 1 wherein the substrate comprises:
an insulative layer defining opposed top and bottom surfaces; and
first and second conductive patterns disposed on respective ones of the top and bottom surfaces of the insulative layer and electrically connected to each other in a prescribed pattern;
the semiconductor die being attached to the top surface of the insulative layer and electrically connected to the first conductive pattern by the conductive wire.

9. A semiconductor package comprising:
a semiconductor die;
a plurality of conductive pads at least partially circumventing the semiconductor die and electrically connected thereto by at least one conductive wire; and
a package body defining a generally planar top surface, a bottom surface, and a side surface, the package body at least partially encapsulating the semiconductor die, the conductive pads and the conductive wire, and being formed such that at least a portion of the conductive wire is exposed in the top surface thereof.

10. The semiconductor package of claim 9 further comprising at least one conductive material layer electrically connected to the exposed portion of the conductive wire.

11. A semiconductor package comprising:
a die pad defining opposed top and bottom pad surfaces;
a plurality of leads which each define opposed top and bottom lead surfaces and extend at least partially about the die pad in spaced relation thereto;
at least one semiconductor die attached to the top pad surface of the die pad and electrically connected to at least some the leads by conductive wires; and
a package body defining opposed top and bottom surfaces, a side surface, and a groove formed in the top surface, the package body at least partially encapsulating the substrate, the conductive wires and the semiconductor die, and being formed such that at least portions of the conductive wires are exposed in the groove.

12. The semiconductor package of claim 11 further comprising a plurality of conductive material layers which are disposed within the groove and electrically connected to the exposed portions of respective ones of the conductive wires.

13. The semiconductor package of claim 12 further comprising a plurality of solder pads which are electrically connected to respective ones of the conductive material layers and sized to protrude from the top surface of the package body.

14. The semiconductor package of claim 13 further in combination with a semiconductor device which is stacked upon the semiconductor package and electrically connected to the solder pads thereof.

15. The semiconductor package of claim 14 wherein the semiconductor device stacked upon and electrically connected to the semiconductor package comprises one of another semiconductor package and a semiconductor die.

16. The semiconductor package of claim 15 wherein the semiconductor device comprises a second semiconductor package which is identically configured to the semiconductor package, the second semiconductor package having bottom lead surfaces which are electrically connected to respective ones of the solder pads of the semiconductor package.

17. The semiconductor package of claim 14 wherein the semiconductor device is electrically connected to the solder pads of the semiconductor package through the use of an intervening interposer.

18. A semiconductor package comprising:
an insulative layer defining opposed top and bottom surfaces; and
first and second conductive patterns disposed on respective ones of the top and bottom surfaces of the insulative layer and electrically connected to each other in a prescribed pattern;
at least one semiconductor die attached to the top surface of the insulative layer and electrically connected to the first conductive pattern by at least one conductive wire; and
a package body defining opposed top and bottom surfaces, a side surface, and a groove formed in the top surface, the package body at least partially encapsulating the substrate, the conductive wire and the semiconductor die, and being formed such that at least a portion of the conductive wire is exposed in the groove.

19. The semiconductor package of claim 18 further comprising a conductive material layer disposed within the groove and electrically connected to the exposed portion of the conductive wire.

20. The semiconductor package of claim 19 further comprising a solder pad electrically connected to the conductive material layer and at least partially residing within the groove.

21. The semiconductor package of claim 20 wherein:
the semiconductor die is electrically connected to the first conductive pattern by a plurality of conductive wires, each of which includes a portion which is exposed in the groove;
a plurality of conductive material layers are disposed within the groove and electrically connected to the exposed portions of respective ones of the conductive wires; and
a plurality of solder pads are electrically connected to the respective ones of the conductive material layers and sized to protrude from the top surface of the package body.

22. The semiconductor package of claim 21 further in combination with a semiconductor device which is stacked upon the semiconductor package and electrically connected to the solder pads thereof.

23. The semiconductor package of claim 22 wherein the semiconductor device stacked upon and electrically connected to the semiconductor package comprises one of another semiconductor package and a semiconductor die.

24. The semiconductor package of claim 23 wherein the semiconductor device comprises a second semiconductor package which is identically configured to the semiconductor package, the bottom lead surfaces of the second semiconductor package being electrically connected to respective ones of the solder pads of the semiconductor package.

25. The semiconductor package of claim 22 wherein the semiconductor device is electrically connected to the solder pads of the semiconductor package through the use of an intervening interposer.

* * * * *